(12) United States Patent
Yamazaki et al.

(10) Patent No.: US 9,966,475 B2
(45) Date of Patent: May 8, 2018

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP);
Toshiyuki Miyamoto, Kanuma (JP);
Masafumi Nomura, Tochigi (JP);
Takashi Hamochi, Shimotsuga (JP);
Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 15/630,012

(22) Filed: Jun. 22, 2017

(65) Prior Publication Data

US 2017/0288063 A1    Oct. 5, 2017

Related U.S. Application Data

(63) Continuation of application No. 14/878,446, filed on Oct. 8, 2015, now Pat. No. 9,711,652, which is a
(Continued)

(30) Foreign Application Priority Data

May 10, 2012    (JP) ................................. 2012-108899

(51) Int. Cl.
*H01L 29/10*    (2006.01)
*H01L 29/786*   (2006.01)
(Continued)

(52) U.S. Cl.
CPC .... *H01L 29/7869* (2013.01); *H01L 29/42384* (2013.01); *H01L 29/513* (2013.01); *H01L 29/517* (2013.01); *H01L 29/518* (2013.01)

(58) Field of Classification Search
CPC ............. H01L 51/5016; H01L 51/5088; H01L 51/0072; H01L 51/5056; C09K 11/06
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    102844872 A    12/2012
EP     1737044 A     12/2006
(Continued)

OTHER PUBLICATIONS

Taiwanese Office Action (Application No. 102116069) dated Jul. 25, 2017.
(Continued)

*Primary Examiner* — Andy Huynh
(74) *Attorney, Agent, or Firm* — Robinson Intellectual Property Law Office; Eric J. Robinson

(57) ABSTRACT

A highly reliable semiconductor device the yield of which can be prevented from decreasing due to electrostatic discharge damage is provided. A semiconductor device is provided which includes a gate electrode layer, a gate insulating layer over the gate electrode layer, an oxide insulating layer over the gate insulating layer, an oxide semiconductor layer being above and in contact with the oxide insulating layer and overlapping with the gate electrode layer, and a source electrode layer and a drain electrode layer electrically connected to the oxide semiconductor layer. The gate insulating layer includes a silicon film containing nitrogen. The oxide insulating layer contains one or more metal elements selected from the constituent elements of the oxide semiconductor layer. The thickness of the
(Continued)

gate insulating layer is larger than that of the oxide insulating layer.

14 Claims, 14 Drawing Sheets

Related U.S. Application Data continuation of application No. 13/875,499, filed on May 2, 2013, now Pat. No. 9,159,837.

(51) Int. Cl.
*H01L 29/423* (2006.01)
*H01L 29/51* (2006.01)

(58) Field of Classification Search
USPC .......................................................... 257/43
See application file for complete search history.

(56) References Cited

U.S. PATENT DOCUMENTS

| | | |
|---|---|---|
| 6,130,119 A | 10/2000 | Jinnai |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,384,080 B2 | 2/2013 | Taniguchi et al. |
| 8,440,510 B2 | 5/2013 | Yamazaki |
| 8,471,256 B2 | 6/2013 | Yamazaki et al. |
| 8,502,217 B2 | 8/2013 | Sato et al. |
| 8,728,883 B2 | 5/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0176383 A1 | 7/2010 | Park et al. |
| 2010/0176399 A1 | 7/2010 | Takeguchi |
| 2010/0264412 A1 | 10/2010 | Yamazaki et al. |
| 2011/0001137 A1 | 1/2011 | Yoon et al. |
| 2011/0070693 A1 | 3/2011 | Yamazaki et al. |
| 2011/0089419 A1 | 4/2011 | Yamazaki et al. |
| 2011/0127524 A1 | 6/2011 | Yamazaki et al. |
| 2011/0210324 A1 | 9/2011 | Sakakura et al. |
| 2011/0210347 A1 | 9/2011 | Takeguchi |
| 2011/0212605 A1 | 9/2011 | Yamazaki et al. |
| 2011/0220897 A1 | 9/2011 | Shin |
| 2011/0240991 A1 | 10/2011 | Yamazaki |
| 2011/0248261 A1 | 10/2011 | Yamazaki |
| 2011/0281394 A1 | 11/2011 | Yamazaki |
| 2011/0284959 A1 | 11/2011 | Kimura et al. |
| 2012/0061663 A1 | 3/2012 | Yamazaki et al. |
| 2012/0064664 A1 | 3/2012 | Yamazaki et al. |
| 2012/0064665 A1 | 3/2012 | Yamazaki |
| 2012/0119205 A1 | 5/2012 | Taniguchi et al. |
| 2013/0299820 A1 | 11/2013 | Miyamoto et al. |
| 2014/0235015 A1 | 8/2014 | Yamazaki et al. |
| 2014/0239298 A1 | 8/2014 | Yamazaki et al. |

FOREIGN PATENT DOCUMENTS

| | | |
|---|---|---|
| EP | 2226847 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 02-009129 A | 1/1990 |
| JP | 03-248569 A | 11/1991 |
| JP | 04-326052 A | 11/1992 |
| JP | 05-251705 A | 9/1993 |
| JP | 08-264794 A | 10/1996 |
| JP | 11-505377 | 5/1999 |
| JP | 11-163368 A | 6/1999 |
| JP | 2000-044236 A | 2/2000 |
| JP | 2000-150900 A | 5/2000 |
| JP | 2000-332012 A | 11/2000 |
| JP | 2000-340562 A | 12/2000 |
| JP | 2002-076356 A | 3/2002 |
| JP | 2002-289859 A | 10/2002 |
| JP | 2002-353222 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073562 A | 3/2007 |
| JP | 2007-096055 A | 4/2007 |
| JP | 2007-123861 A | 5/2007 |
| JP | 2009-141002 A | 6/2009 |
| JP | 2010-073881 A | 4/2010 |
| JP | 2010-165774 A | 7/2010 |
| JP | 2011-181596 A | 9/2011 |
| JP | 2011-186424 A | 9/2011 |
| JP | 2011-228689 A | 11/2011 |
| JP | 2011-233880 A | 11/2011 |
| JP | 2011-258939 A | 12/2011 |
| JP | 2012-059860 A | 3/2012 |
| KR | 2013-0014562 A | 2/2013 |
| TW | 201203392 | 1/2012 |
| TW | 201208069 | 2/2012 |
| TW | 201244082 | 11/2012 |
| WO | WO-2004/114391 | 12/2004 |
| WO | WO-2009/072532 | 6/2009 |
| WO | WO-2010/098101 | 9/2010 |
| WO | WO-2011/122363 | 10/2011 |
| WO | WO-2011/142467 | 11/2011 |

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M.et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
International Search Report (Application No. PCT/JP2013/062517) dated Aug. 6, 2013.
Written Opinion (Application No. PCT/JP2013/062617) dated Aug. 6, 2013.
Sze.S et al., "6.5.2 Gate Stack", Physics of Semiconductor Devices, Third Edition, Oct. 1, 2006, p. 340, John Wiley & Sons.
Taiwanese Office Action (Application No. 102116069) Dated Nov. 30, 2017.

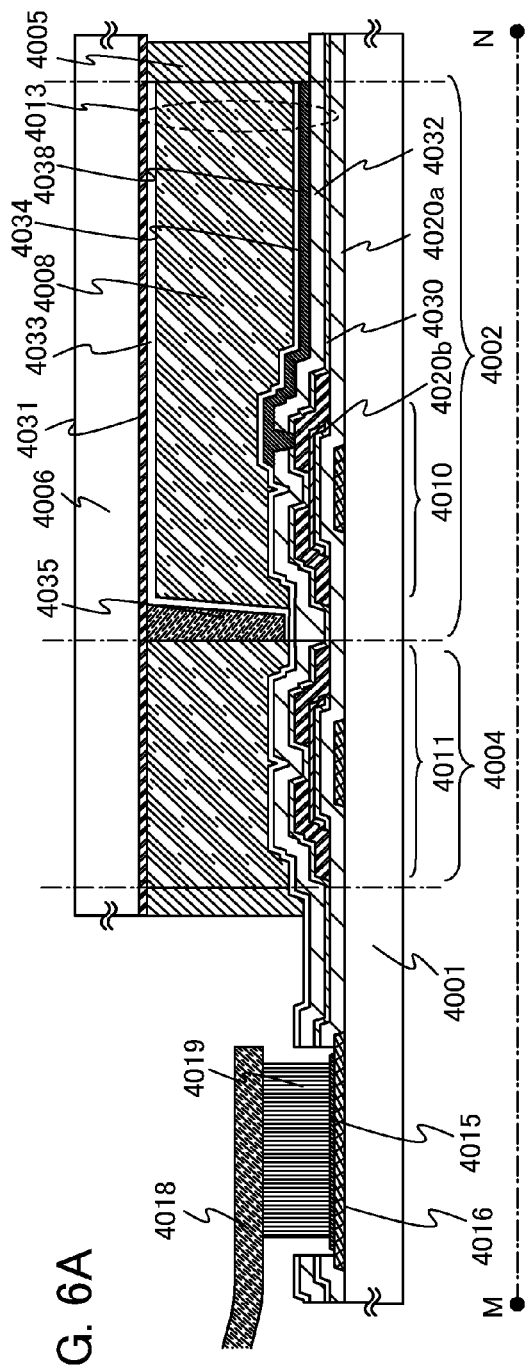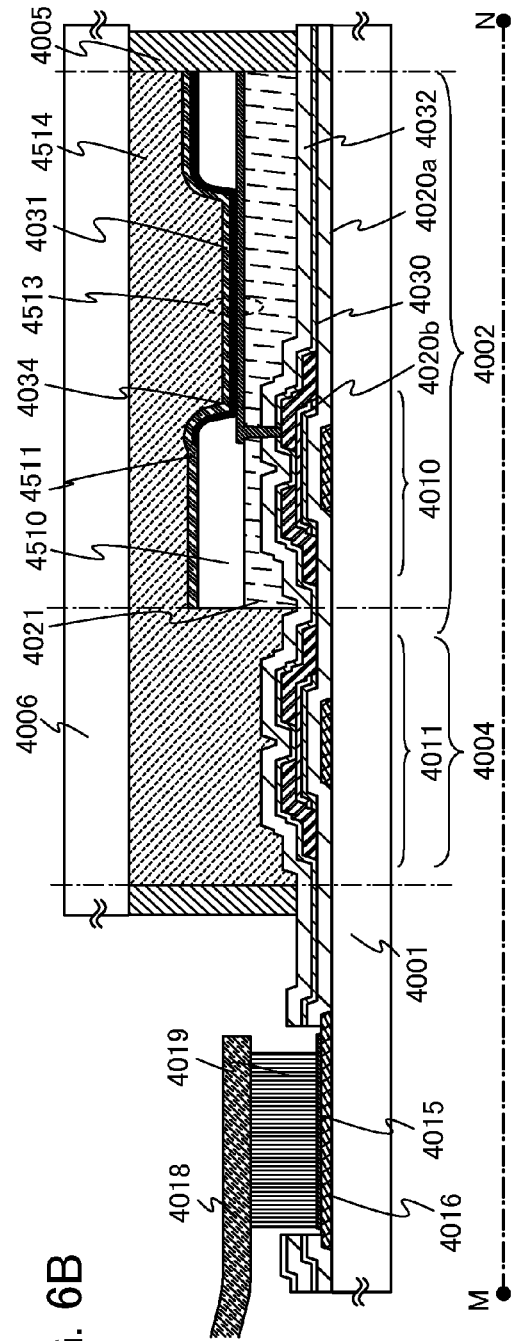

SEMICONDUCTOR DEVICE

TECHNICAL FIELD

An embodiment of the invention disclosed in this specification and the like relates to a semiconductor device and a method for manufacturing the semiconductor device.

In this specification and the like, a semiconductor device generally means a device which can function by utilizing semiconductor characteristics, and an electro-optical device, a light-emitting display device, a semiconductor circuit, and an electronic device are all semiconductor devices.

BACKGROUND ART

Attention has been focused on a technique for forming a transistor using a semiconductor thin film formed over a substrate having an insulating surface. The transistor is applied to a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has been attracting attention.

For example, a technique for forming a transistor using zinc oxide or an In—Ga—Zn-based oxide semiconductor as an oxide semiconductor is disclosed (see Patent Documents 1 and 2).

REFERENCE

Patent Documents

[Patent Document 1] Japanese Published Patent Application No. 2007-123861
[Patent Document 2] Japanese Published Patent Application No. 2007-96055

DISCLOSURE OF INVENTION

In consideration of cost and speed of development for mass production of semiconductor devices with oxide semiconductors, it is preferable to utilize mass production technology currently in practical use, i.e., a transistor structure, process conditions, a production apparatus, or the like for a silicon-based semiconductor material such as amorphous silicon or polycrystalline silicon.

However, the mechanism of carrier generation in an oxide semiconductor is greatly different from that in a silicon-based semiconductor material. Physical properties of the oxide semiconductor greatly affect characteristics or reliability of a transistor.

In particular, when a gate insulating layer used for the silicon-based semiconductor material is used for an oxide semiconductor, the gate insulating layer does not provide excellent interface properties with the oxide semiconductor. Accordingly, development of a gate insulating layer suitable for use in a semiconductor device including an oxide semiconductor has been needed.

For a semiconductor device including a transistor formed using a silicon-based semiconductor material such as amorphous silicon or polycrystalline silicon, a glass substrate of the eighth generation (2160 mm wide×2460 mm long) or later can be used. Thus, such a semiconductor device has advantages of high productivity and low cost. However, in the case of using such a glass substrate, because of its high insulating properties and large area, there arises the problem of electrostatic discharge (ESD) damage. This problem should inevitably be taken into consideration also in the case of using an oxide semiconductor material.

In view of such a technical background, an object of one embodiment of the present invention is to provide a highly reliable and electrically stable semiconductor device with a small number of changes in the transistor structure, the process conditions, the production apparatus, or the like from the mass production technology that has been put to practical use.

Another object of one embodiment of the present invention is to provide a semiconductor device the yield of which can be prevented from decreasing due to electrostatic discharge damage.

One embodiment of the disclosed invention is a semiconductor device including, between a gate electrode layer and an oxide semiconductor layer, a structure including a silicon film containing nitrogen and an oxide insulating layer containing one or more metal elements selected from the constituent elements of the oxide semiconductor layer which are stacked in this order from the side closer to the gate electrode layer.

The silicon film containing nitrogen has a higher relative permittivity than a silicon oxide film and therefore needs a larger thickness for an equivalent capacitance. Thus, when the silicon film containing nitrogen is used for the gate insulating layer, the physical thickness of the gate insulating layer can be increased, which makes it possible to reduce a decrease in withstand voltage and preferably increase withstand voltage. Accordingly, it is possible to reduce electrostatic discharge damage to a semiconductor device including such a gate insulating layer.

It is preferable that the thickness of the silicon film containing nitrogen be greater than or equal to 325 nm and less than or equal to 550 nm, more preferably greater than or equal to 355 nm and less than or equal to 550 nm. As the silicon film containing nitrogen, a silicon nitride film is preferably used.

The silicon film containing nitrogen has been practically used as a gate insulating layer for a silicon-based semiconductor material such as amorphous silicon or polycrystalline silicon, and therefore, the same process conditions, production apparatus, or the like can be employed. Thus, the use of the silicon film containing nitrogen as a gate insulating layer enables transistors with an oxide semiconductor to be mass-produced at low cost.

When the oxide insulating layer containing one or more metal elements selected from the constituent elements of the oxide semiconductor layer is provided in contact with the oxide semiconductor layer, the interface between the oxide insulating layer and the oxide semiconductor layer can be kept in a favorable condition and can be prevented from being degraded. In particular, carrier capturing at the interface between the oxide insulating layer and the oxide semiconductor layer is reduced, so that photodegradation (for example, negative-bias temperature stress degradation) of a transistor can be decreased, whereby a highly reliable transistor can be obtained.

That is, according to one embodiment of the present invention, a stacked-layer structure of a silicon film containing nitrogen, an oxide insulating layer containing one or more metal elements selected from the constituent elements of an oxide semiconductor layer, and the oxide semiconductor layer is formed partly utilizing the mass production technology that has been put to practical use for silicon-based semiconductor materials; it is possible to provide a semiconductor device having a novel advantageous effect which is different from those of semiconductor devices formed using silicon-based semiconductor materials. Specifically, the following structures can be employed, for example.

One embodiment of the present invention is a semiconductor device which includes a gate electrode layer, a gate insulating layer over the gate electrode layer, an oxide insulating layer over the gate insulating layer, an oxide semiconductor layer being above and in contact with the oxide insulating layer and overlapping with the gate electrode layer, and a source electrode layer and a drain electrode layer electrically connected to the oxide semiconductor layer. The gate insulating layer includes a silicon film containing nitrogen. The oxide insulating layer contains one or more metal elements selected from the constituent elements of the oxide semiconductor layer. The thickness of the gate insulating layer is larger than that of the oxide insulating layer.

In the above-described semiconductor device, it is preferable that end portions of the oxide semiconductor layer and the oxide insulating layer be aligned with each other. Note that in this specification and the like, "aligned" includes "substantially aligned". For example, an end portion of a layer A and an end portion of a layer B, which are included in a stacked-layer structure etched using the same mask, are considered to be aligned with each other.

In addition to the stacked-layer structure of the oxide insulating layer containing one or more metal elements selected from the constituent elements of the oxide semiconductor layer and the silicon film containing nitrogen, which is provided below and in contact with the oxide semiconductor layer, the stacked-layer structure may also be provided above and in contact with the oxide semiconductor layer. Such a structure enables the semiconductor device to have more stable electrical characteristics and/or to be prevented from being damaged by electrostatic discharge.

That is, another embodiment of the present invention is a semiconductor device which includes a gate electrode layer, a gate insulating layer over the gate electrode layer, a first oxide insulating layer over the gate insulating layer, an oxide semiconductor layer being above and in contact with the first oxide insulating layer and overlapping with the gate electrode layer, a source electrode layer and a drain electrode layer electrically connected to the oxide semiconductor layer, a second oxide insulating layer covering the source electrode layer and the drain electrode layer and being in contact with part of the oxide semiconductor layer, and a protective insulating layer over the second oxide insulating layer. The gate insulating layer and the protective insulating layer each include a silicon film containing nitrogen. The first oxide insulating layer and the second oxide insulating layer each contain one or more metal elements selected from the constituent elements of the oxide semiconductor layer. The thickness of the gate insulating layer is larger than that of the first oxide insulating layer. The thickness of the protective insulating layer is larger than that of the second oxide insulating layer.

In the above-described semiconductor device, it is preferable that end portions of the oxide semiconductor layer and the first oxide insulating layer be aligned with each other.

In one of the above-described semiconductor devices, it is preferable that the thickness of the gate insulating layer be greater than or equal to 325 nm and less than or equal to 550 nm. As the gate insulating layer, a silicon nitride film is preferably used.

It is preferable that the oxide insulating layer in contact with the oxide semiconductor layer include a region containing oxygen in excess of the stoichiometric composition (hereinafter, an oxygen-excess region). By making the oxide insulating layer in contact with the oxide semiconductor layer include an oxygen-excess region, supply of oxygen to the oxide semiconductor layer becomes possible. Oxygen vacancies in an oxide semiconductor serve as donors to generate electrons that are carriers in the oxide semiconductor. By filling the oxygen vacancies by supplying oxygen to the oxide semiconductor layer, a highly reliable transistor can be obtained.

A semiconductor device according to one embodiment of the present invention is manufactured by a manufacturing method with a small number of changes from the mass production technology that has been put to practical use, and has stable electrical characteristics and high reliability.

In addition, according to one embodiment of the present invention, it is possible to provide a semiconductor device the yield of which can be prevented from decreasing due to electrostatic discharge damage.

BRIEF DESCRIPTION OF DRAWINGS

FIGS. 6A and 6B each illustrate one embodiment of a semiconductor device.

BEST MODE FOR CARRYING OUT THE INVENTION

Figure 1A:
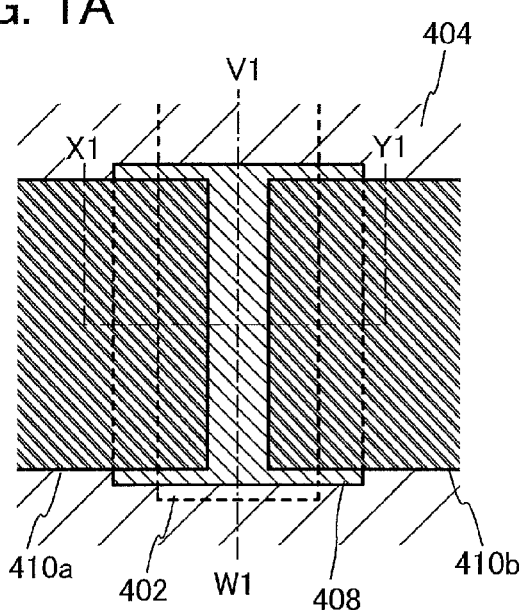
FIGS. 1A to 1C are a plan view and cross-sectional views illustrating one embodiment of a semiconductor device.

Embodiments of the present invention will be described in detail below with reference to drawings. Note that the present invention is not limited to the description below, and it is easily understood by those skilled in the art that modes and details of the present invention can be modified in various ways. Therefore, the present invention should not be construed as being limited to the description in the embodiments given below.

Note that in the structures of the invention described below, the same portions or portions having similar functions are denoted by the same reference numerals in different drawings, and description of such portions is not repeated.

The same hatch pattern is applied to parts having a similar function, and the parts are not especially denoted by reference numerals in some cases.

Note that in each drawing described in this specification, the size, the film thickness, or the region of each component may be exaggerated for clarity. Therefore, embodiments of the present invention are not limited to such scales.

Note that ordinal numbers such as "first" and "second" in this specification and the like are used for convenience and do not denote the order of steps or the stacking order of layers. In addition, the ordinal numbers in this specification and the like do not denote any particular names to define the invention.

Embodiment 1

In this embodiment, embodiments of a semiconductor device and a method for manufacturing the semiconductor device will be described with reference to FIGS. 1A to 1C, FIGS. 2A to 2C, FIGS. 3A to 3D, FIGS. 10A to 10C, and FIGS. 11A to 11C. In this embodiment, bottom-gate transistors including oxide semiconductor layers are described as one example of a semiconductor device.

<Structural Example 1 of Semiconductor Device>

Figure 1C:
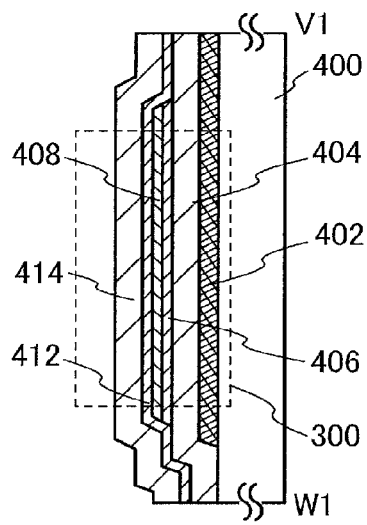
Figure 1B:
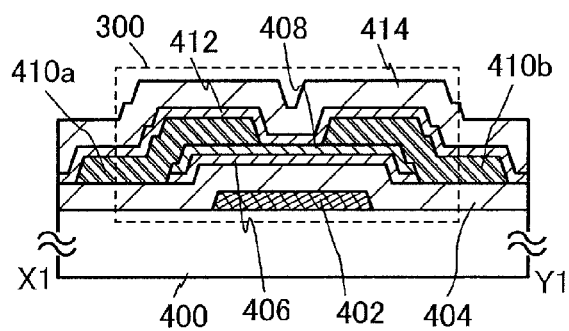

FIGS. 1A to 1C illustrate a structural example of a transistor 300. FIG. 1A is a plan view of the transistor 300, FIG. 1B is a cross-sectional view taken along the chain line X1-Y1 in FIG. 1A, and FIG. 1C is a cross-sectional view taken along the chain line V1-W1 in FIG. 1A.

The transistor 300 includes a gate electrode layer 402 over a substrate 400 having an insulating surface, a gate insulating layer 404 over the gate electrode layer 402, an oxide insulating layer 406 over the gate insulating layer 404, an oxide semiconductor layer 408 being above and in contact with the oxide insulating layer 406 and overlapping with the gate electrode layer 402, and a source electrode layer 410a and a drain electrode layer 410b electrically connected to the oxide semiconductor layer 408.

In the transistor 300, the gate insulating layer 404 includes a silicon film containing nitrogen. The silicon film containing nitrogen has a higher relative permittivity than a silicon oxide film and needs a larger thickness for an equivalent capacitance. Thus, the physical thickness of the gate insulating layer can be increased. This makes it possible to reduce a decrease in withstand voltage of the transistor 300 and furthermore increase the withstand voltage, thereby reducing electrostatic discharge damage to a semiconductor device.

The thickness of the gate insulating layer 404 is larger than at least that of the oxide insulating layer 406 and is preferably greater than or equal to 325 nm and less than or equal to 550 nm, more preferably greater than or equal to 355 nm and less than or equal to 550 nm.

Examples of the silicon film containing nitrogen include a silicon nitride film, a silicon nitride oxide film, a silicon oxynitride film, and the like. Since a material with a higher nitrogen content has a higher relative permittivity, it is preferable to use a silicon nitride film. Silicon oxide has an energy gap of 8 eV, whereas silicon nitride has a small energy gap of 5.5 eV and accordingly has a low resistivity. Thus, the use of a silicon nitride film can increase resistance to ESD. In addition, in the case where a silicon nitride film is formed by a CVD method, it is not necessary to use an $N_2O$ gas that is a greenhouse gas and is used when a silicon film containing oxygen and nitrogen such as a silicon nitride oxide film is formed by a CVD method. Note that in this specification, "silicon oxynitride film" refers to a film that contains more oxygen than nitrogen, and "silicon nitride oxide film" refers to a film that contains more nitrogen than oxygen.

In the transistor 300, the oxide insulating layer 406 contains one or more metal elements selected from the constituent elements of the oxide semiconductor layer 408. Since the oxide insulating layer 406 is formed using such a material, it is possible to stabilize the interface between the oxide insulating layer 406 and the oxide semiconductor layer 408 and reduce charge trapping at the interface. Thus, it is possible to prevent degradation of a transistor, particularly photodegradation, and thus obtain a highly reliable transistor.

Specifically, as the oxide insulating layer 406, it is preferable to provide a gallium oxide film (also referred to as $GaO_x$ (note that x is not necessarily a natural number and may be a non-natural number)), a gallium zinc oxide film (also referred to as $Ga_2Zn_xO_y$ (x=1 to 5)), a $Ga_2O_3(Gd_2O_3)$ film, an In—Ga—Zn-based oxide insulating film with a high gallium content and a low indium content, or the like, for example.

The oxide insulating layer 406 and the oxide semiconductor layer 408 may have different compositions of the same constituent elements. For example, in the case where an In—Ga—Zn-based oxide semiconductor layer is used as the oxide semiconductor layer 408, since the energy gap can be controlled by the ratio between indium (In) and gallium (Ga), the oxide semiconductor layer 408 may have an atomic ratio of In:Ga:Zn=1:1:1 or In:Ga:Zn=3:1:2 and the oxide insulating layer 406 may have an atomic ratio of In:Ga:Zn=1:3:2. Note that the oxide insulating layer 406 and the oxide semiconductor layer 408 can be formed by a sputtering method, and with a sputtering target containing indium, generation of particles during film formation can be reduced. Thus, the oxide insulating layer 406 containing indium and the oxide semiconductor layer 408 containing indium are preferable.

Note that in the example of the transistor 300 illustrated in FIGS. 1A to 1C, by etching treatment for processing the oxide semiconductor layer 408 into an island shape, the oxide insulating layer 406 is also processed into an island shape. Thus, end portions of the oxide semiconductor layer 408 and the oxide insulating layer 406 are aligned with each other.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In this specification, the trigonal and rhombohedral crystal systems are included in the hexagonal crystal system.

In a transistor using the CAAC-OS film, change in electrical characteristics due to irradiation with visible light or ultraviolet light is small. Thus, the transistor has high reliability.

Note that the oxide semiconductor layer 408 may have any structure of an amorphous oxide semiconductor layer, a microcrystalline oxide semiconductor layer, or a CAAC-OS film, for example, or may be a mixed film thereof or a stacked film including two or more films of these structures.

Note that in some cases, the oxide insulating layer 406 has lower crystallinity than the oxide semiconductor layer 408. The oxide insulating layer 406 may include an amorphous part or a nanocrystal.

As other components, the transistor 300 may include an oxide insulating layer 412 covering the source electrode layer 410a and the drain electrode layer 410b and being in contact with the oxide semiconductor layer 408 and/or a protective insulating layer 414 over the oxide insulating layer 412.

As the oxide insulating layer 412, it is preferable to use a layer containing one or more metal elements selected from the constituent elements of the oxide semiconductor layer 408, like the oxide insulating layer 406. When such a material is used, it is possible to stabilize the interface between the oxide insulating layer 412 and the oxide semiconductor layer 408. Since the oxide insulating layer 412 is an insulating layer in contact with the back channel side of the oxide semiconductor layer 408, charge trapping at the interface between the two layers is reduced, whereby generation of a parasitic channel can be reduced.

In addition, when oxide insulating layers containing one or more metal elements selected from the constituent elements of the oxide semiconductor layer 408 are provided above and below and in contact with the oxide semiconductor layer 408 such that the oxide semiconductor layer 408 is sandwiched therebetween, the oxide insulating layers may serve to block the entry of impurities that can adversely affect the oxide semiconductor layer (such as nitrogen and metal elements) from the outside by diffusion. Accordingly, when the oxide insulating layers are provided such that the oxide semiconductor layer is sandwiched therebetween or surrounded therewith, the composition and purity of the oxide semiconductor layer surrounded can be kept constant, and a semiconductor device having stable electrical characteristics can be obtained.

As the protective insulating layer 414, a silicon oxide film, a gallium oxide film, an aluminum oxide film, a silicon nitride film, a silicon oxynitride film, an aluminum oxynitride film, a silicon nitride oxide film, or the like can be used.

<Structural Example 2 of Semiconductor Device>

Figure 2A:
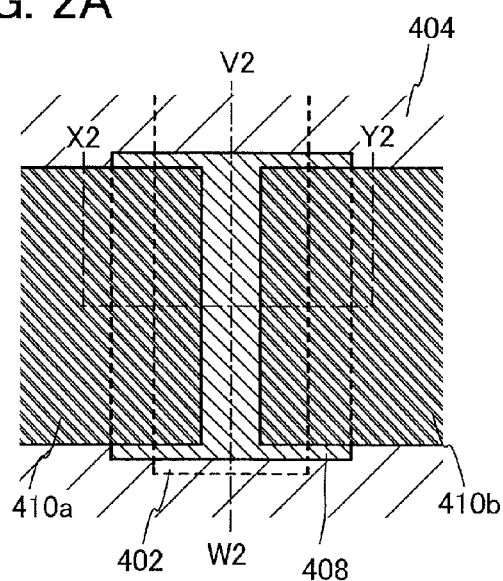
FIGS. 2A to 2C are a plan view and cross-sectional views illustrating one embodiment of a semiconductor device.
Figure 2C:
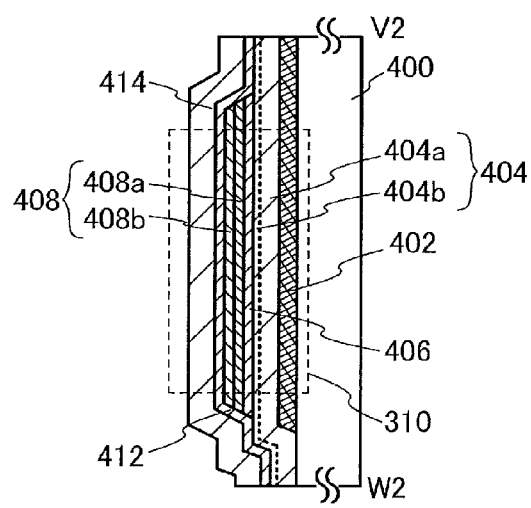
Figure 2B:
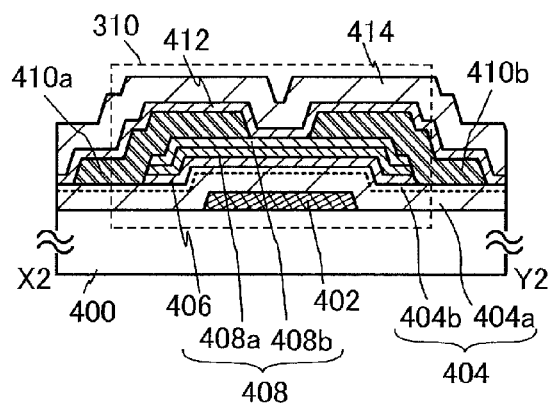

FIGS. 2A to 2C illustrate a structural example of a transistor 310. FIG. 2A is a plan view of the transistor 310, FIG. 2B is a cross-sectional view taken along the chain line X2-Y2 in FIG. 2A, and FIG. 2C is a cross-sectional view taken along the chain line V2-W2 in FIG. 2A.

Like the transistor 300 in FIGS. 1A to 1C, the transistor 310 illustrated in FIGS. 2A to 2C includes a gate electrode layer 402 over a substrate 400 having an insulating surface, a gate insulating layer 404 over the gate electrode layer 402, an oxide insulating layer 406 over the gate insulating layer 404, an oxide semiconductor layer 408 being above and in contact with the oxide insulating layer 406 and overlapping with the gate electrode layer 402, and a source electrode layer 410a and a drain electrode layer 410b electrically connected to the oxide semiconductor layer 408. As other components, the transistor 310 may include an oxide insulating layer 412 covering the source electrode layer 410a and the drain electrode layer 410b and being in contact with the oxide semiconductor layer 408 and a protective insulating layer 414 over the oxide insulating layer 412.

The transistor 310 differs from the transistor 300 in the structures of the gate insulating layer 404 and the oxide semiconductor layer 408. That is, the gate insulating layer 404 in the transistor 310 includes a gate insulating layer 404a in contact with the gate electrode layer 402 and a gate insulating layer 404b between the gate insulating layer 404a and the oxide insulating layer 406. The oxide semiconductor layer 408 in the transistor 310 includes an oxide semiconductor layer 408a in contact with the oxide insulating layer 406 and an oxide semiconductor layer 408b in contact with the oxide insulating layer 412. Note that other components than the gate insulating layer 404 and the oxide semiconductor layer 408 in the transistor 310 are similar to those in the transistor 300, for which the description of the transistor 300 can be referred to.

In the transistor 310, the gate insulating layer 404a and the gate insulating layer 404b each include a silicon nitride film.

The gate insulating layer 404a has a larger thickness than the gate insulating layer 404b and includes a silicon nitride film including a small number of defects. For example, the thickness of the gate insulating layer 404a is greater than or equal to 300 nm and less than or equal to 400 nm. In addition, a silicon nitride film is used which has a spin density of $1\times10^{17}$ spins/cm$^3$ or less, preferably $5\times10^{16}$ spins/cm$^3$ or less corresponding to a signal that appears at an Nc center (at a g-factor of 2.003) in electron spin resonance (ESR) spectroscopy. When such a silicon nitride film having a large thickness (e.g., 300 nm or more) and including a small number of defects is provided, the withstand voltage of the gate insulating layer 404a can be 300 V or more, for example.

Since the gate insulating layer 404b is in contact with the oxide semiconductor layer 408, the gate insulating layer 404b should include a silicon nitride film having a low concentration of hydrogen contained therein, and the hydrogen concentration should be lower than at least that of the gate insulating layer 404a. For example, in the case where the gate insulating layer 404a and the gate insulating layer 404b are formed by a plasma CVD method, the hydrogen concentration of the gate insulating layer 404b can be made lower than that of the gate insulating layer 404a by decreasing the concentration of hydrogen contained in a supply gas. Specifically, in the case where silicon nitride films are formed as the gate insulating layer 404a and the gate insulating layer 404b, the gate insulating layer 404b may be formed at a lower ammonia flow rate than in a supply gas for forming the gate insulating layer 404a, or may be formed without using ammonia.

The thickness of the gate insulating layer 404b is greater than or equal to 25 nm and less than or equal to 150 nm. Since the silicon nitride film having a low concentration of hydrogen contained therein is provided as the gate insulating layer 404b, it is possible to reduce the entry of hydrogen or a hydrogen compound (e.g., water) into the oxide insulating layer 406 and the oxide semiconductor layer 408. Hydrogen in an oxide semiconductor causes carriers to be generated and a threshold voltage of a transistor to be shifted in the negative direction. Thus, when a silicon nitride film having a low hydrogen concentration is provided as the gate insulating layer 404b, the electrical characteristics of a transistor can be stabilized. In addition, when a silicon nitride film having a low hydrogen concentration is provided as the gate insulating layer 404b, the gate insulating layer 404b also serves as a barrier film to prevent impurities such as hydrogen or a hydrogen compound contained in the gate insulating layer 404a from diffusing into the oxide insulating layer 406 and the oxide semiconductor layer 408.

Note that both the gate insulating layer 404a and the gate insulating layer 404b in this embodiment are silicon nitride films, and the interface between these gate insulating layers may become vague depending on materials or film formation conditions. Thus, in FIGS. 2B and 2C, the interface between the gate insulating layer 404a and the gate insulating layer 404b is illustrated schematically with a dotted line. The same applies to other drawings described below.

It is preferable that the oxide semiconductor layer 408a and the oxide semiconductor layer 408b included in the oxide semiconductor layer 408 have different compositions of the same constituent elements. In the case where oxide semiconductor layers containing indium and gallium are formed as the oxide semiconductor layer 408a and the oxide semiconductor layer 408b, it is preferable that the content of indium be higher than the content of gallium (In>Ga) in the oxide semiconductor layer 408a that is on the side closer to the gate electrode layer 402 (on the channel side). It is also preferable that the content of indium be lower than or equal to the content of gallium (In≤Ga) in the oxide semiconductor layer 408b that is on the side farther from the gate electrode layer 402 (on the back channel side).

In an oxide semiconductor, the s orbital of heavy metal mainly contributes to carrier conduction, and when the indium content in the oxide semiconductor is increased, overlaps of the s orbitals are likely to be increased. Therefore, an oxide having a composition of In>Ga has higher mobility than an oxide having a composition of In≤Ga. Further, in Ga, the formation energy of an oxygen vacancy is larger and thus oxygen vacancies are less likely to be generated, than in In; therefore, the oxide having a composition of In≤Ga has more stable characteristics than the oxide having a composition of In>Ga.

An oxide semiconductor having a composition of In>Ga is used on the channel side, and an oxide semiconductor having a composition of In≤Ga is used on the back channel side, so that mobility and reliability of a transistor can be further improved. For example, the oxide semiconductor layer 408a may have an atomic ratio of In:Ga:Zn=3:1:2 and the oxide semiconductor layer 408b may have an atomic ratio of In:Ga:Zn=1:1:1.

Note that it is preferable that the oxide insulating layer 406 in contact with the oxide semiconductor layer 408a and the oxide semiconductor layer 408a have different compositions of the same constituent elements so that the oxide insulating layer 406 has an insulating property, because the interface of the two can be further stabilized. The same applies to the oxide insulating layer 412 in contact with the oxide semiconductor layer 408b.

Further, oxide semiconductors having different crystallinities may be used for the oxide semiconductor layer 408a and the oxide semiconductor layer 408b. That is, the oxide semiconductor layers 408a and 408b may be formed using a combination of any of a single crystal oxide semiconductor, a polycrystalline oxide semiconductor, a nanocrystalline oxide semiconductor, an amorphous oxide semiconductor, and CAAC-OS as appropriate. Note that an amorphous oxide semiconductor is likely to absorb impurities such as hydrogen and is likely to have oxygen vacancies, and thus easily becomes n-type. Therefore, the oxide semiconductor layer 408a on the channel side is preferably formed using a crystalline oxide semiconductor such as CAAC-OS.

When the oxide semiconductor layer 408b on the back channel side is formed using an amorphous oxide semiconductor, the oxide semiconductor layer 408b is likely to have oxygen vacancies and easily becomes n-type by etching treatment for forming the source electrode layer 410a and the drain electrode layer 410b. Thus, it is preferable that the oxide semiconductor layer 408b be formed using a crystalline oxide semiconductor.

Figure 14:
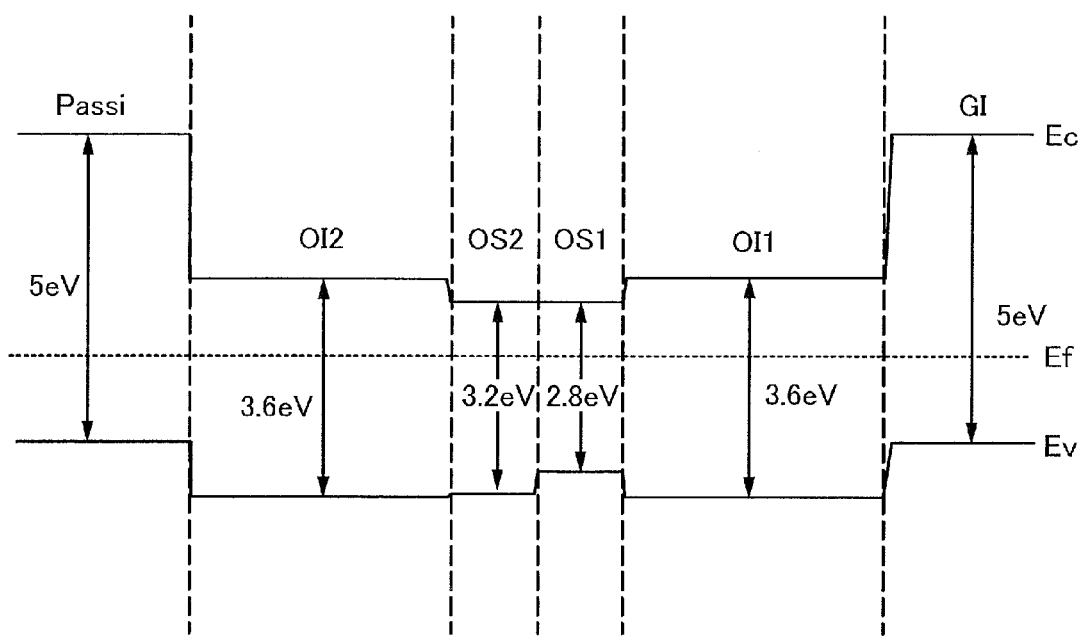
FIG. 14 is an energy band diagram of a stacked-layer structure included in a transistor in one embodiment of the present invention.

FIG. 14 is an energy band diagram (schematic diagram) of a transistor in this embodiment which has a stacked structure of a gate insulating layer GI, an oxide insulating layer OI1, oxide semiconductor layers OS1 and OS2, an oxide insulating layer OI2, and a protective insulating layer Passi. Assuming an ideal situation where the gate insulating layer, the oxide insulating layers, the oxide semiconductor layers, and the protective insulating layer are all intrinsic, FIG. 14 illustrates the case where the gate insulating layer GI and the protective insulating layer Passi are silicon nitride films (band gap Eg: 5 eV), the oxide insulating layer OI1 and the oxide insulating layer OI2 are In—Ga—Zn-based oxide insulating layers where In:Ga:Zn=1:3:2 (band gap Eg: 3.6 eV), the oxide semiconductor layer OS1 is an In—Ga—Zn-based oxide semiconductor layer where In:Ga:Zn=3:1:2 (band gap Eg: 2.8 eV), and the oxide semiconductor layer OS2 is an In—Ga—Zn-based oxide semiconductor layer where In:Ga:Zn=1:1:1 (band gap Eg: 3.2 eV).

Note that it is assumed in FIG. 14 that the oxide insulating layer OI1, the oxide insulating layer OI2, the oxide semiconductor layer OS1, and the oxide semiconductor layer OS2 all have a relative permittivity of 15. It is also assumed that the oxide insulating layer OI1 and the oxide insulating layer OI2 have a mobility of 4 $cm^2/Vs$, the oxide semiconductor layer OS1 has a mobility of 25 $cm^2/Vs$, and the oxide semiconductor layer OS2 has a mobility of 10 $cm^2/Vs$. Furthermore, it is assumed that the gate insulating layer GI has a thickness of 325 nm, the oxide insulating layer OI1 has a thickness of 30 nm, the oxide semiconductor layer OS1 has a thickness of 10 nm, the oxide semiconductor layer OS2 has a thickness of 10 nm, the oxide insulating layer OI2 has a thickness of 30 nm, and the protective insulating layer Passi has a thickness of 300 nm. Based on these assumptions, calculation is carried out.

As illustrated in FIG. 14, on the gate electrode side (channel side) of the oxide semiconductor layer OS1, an energy barrier exists at the interface between the oxide semiconductor layer OS1 and the oxide insulating layer OI1. Similarly, on the back channel side (opposite to the gate electrode side) of the oxide semiconductor layer OS2, an energy barrier exists at the interface between the oxide semiconductor layer OS2 and the oxide insulating layer OI2. Since such energy barriers exist at the interfaces between the oxide semiconductor layers and the oxide insulating layers, transfer of carriers at the interfaces can be prevented; thus, the carriers travel inside the oxide semiconductor layers and do not travel from the oxide semiconductor layers to the oxide insulating layers. That is, when a stacked structure is formed such that the oxide semiconductor layers are sandwiched between materials whose band gaps are wider than that of the oxide semiconductor stepwise, carriers travel inside the oxide semiconductor layer OS1 and the oxide semiconductor layer OS2.

<Method for Manufacturing Semiconductor Device>

An example of a method for manufacturing the transistor 310 will be described below with reference to FIGS. 3A to 3D.

First, the gate electrode layer 402 is formed over the substrate 400 having an insulating surface.

Although there is no particular limitation on a substrate which can be used as the substrate 400 having an insulating surface, it is at least necessary that the substrate have heat resistance sufficient to withstand heat treatment performed later. For example, a glass substrate of barium borosilicate glass, aluminoborosilicate glass, or the like, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 400. Still alternatively, any of these substrates further provided with a semiconductor element may be used as the substrate 400.

The gate electrode layer 402 can be formed using a metal material such as molybdenum, titanium, tantalum, tungsten, aluminum, copper, chromium, neodymium, or scandium, or an alloy material which contains any of these materials as a main component. Alternatively, a semiconductor film typified by a polycrystalline silicon film doped with an impurity element such as phosphorus, or a silicide film such as a nickel silicide film may be used as the gate electrode layer 402. The gate electrode layer 402 may have either a single-layer structure or a stacked-layer structure. The gate electrode layer 402 may have a tapered shape with a taper angle of more than or equal to 30° and less than or equal to 70° for example. Here, the taper angle refers to an angle formed between a side surface of a layer having a tapered shape and a bottom surface of the layer.

The material of the gate electrode layer 402 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Alternatively, the material of the gate electrode layer 402 may be an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (such as indium nitride, zinc nitride, tantalum nitride, or tungsten nitride). These materials each have a work function of 5 eV or higher, which enables the threshold voltage of the transistor to be positive when used for the gate electrode layer 402. Accordingly, a normally off switching transistor can be provided.

Figure 3A:
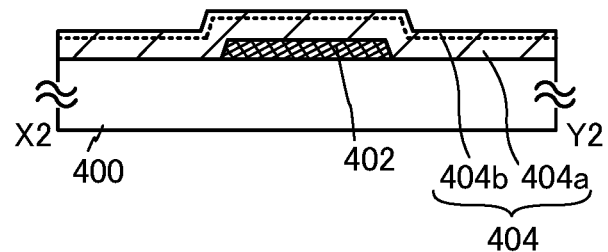
FIGS. 3A to 3D illustrate an example of a manufacturing process of a semiconductor device.

Next, the gate insulating layer 404 including the gate insulating layer 404a and the gate insulating layer 404b is formed so as to cover the gate electrode layer 402 (see FIG. 3A). A silicon film containing nitrogen can be used for the gate insulating layer 404. In this embodiment, the gate insulating layer 404 is formed by stacking the gate insulating layer 404a including a silicon nitride film and the gate insulating layer 404b including a silicon nitride film. In terms of reductions in in-plane variation, mixing of particles, and film formation takt time (cycle time), it is effective to use a CVD method to form the gate insulating layer 404. A CVD method is also effective in forming a film over a large-sized substrate.

In this embodiment, the gate insulating layer 404a and the gate insulating layer 404b are successively formed by a plasma CVD method. First, using a mixed gas of silane ($SiH_4$), nitrogen ($N_2$), and ammonia ($NH_3$) as a supply gas, a silicon nitride film is formed as the gate insulating layer 404a, and then the supply gas is changed to a mixed gas of silane ($SiH_4$) and nitrogen ($N_2$) and a silicon nitride film is formed as the gate insulating layer 404b.

The silicon nitride film formed by a plasma CVD method using a mixed gas of silane ($SiH_4$), nitrogen ($N_2$), and ammonia ($NH_3$) as a supply gas includes fewer defects than the silicon nitride film formed using a mixed gas of silane ($SiH_4$) and nitrogen ($N_2$) as a supply gas. Thus, the gate insulating layer 404a includes fewer defects than at least the gate insulating layer 404b, and can have a spin density of $1 \times 10^{17}$ spins/cm$^3$ or less, preferably $5 \times 10^{16}$ spins/cm$^3$ or less, corresponding to a signal that appears at an Nc center (at a g-factor of 2.003) in electron spin resonance (ESR) spectroscopy. A silicon nitride film formed using a mixed gas including ammonia provides better coverage than that formed using a mixed gas of silane and nitrogen as a supply gas. Thus, it is effective to provide a silicon nitride film formed using the above-described mixed gas, as a gate insulating layer in contact with the gate electrode layer 402. When the gate insulating layer 404a including a small number of defects is formed so as to have a thickness greater than or equal to 300 nm and less than or equal to 400 nm, the withstand voltage of the gate insulating layer 404 can be 300 V or more.

Meanwhile, the gate insulating layer 404b formed with a source gas containing no ammonia has a lower concentration of hydrogen contained therein than the gate insulating layer 404a. When such a film having a thickness greater than or equal to 25 nm and less than or equal to 150 nm is provided between the oxide insulating layer 406 and the gate electrode layer 402, it is possible to reduce the entry of hydrogen from the gate insulating layer 404b into the oxide insulating layer 406 and the oxide semiconductor layer 408. The gate insulating layer 404b also functions as a barrier film which reduces the entry of hydrogen or a hydrogen compound contained in the gate insulating layer 404a into the oxide insulating layer 406 and the oxide semiconductor layer 408.

When the gate insulating layer 404a having a large thickness and including a small number of defects and the gate insulating layer 404b having a low hydrogen concentration are stacked as the gate insulating layer 404, it is possible to obtain a favorable withstand voltage and, at the same time, reduce the diffusion of an impurity such as hydrogen into the oxide insulating layer 406 and the oxide semiconductor layer 408. Thus, it is possible to reduce electrostatic discharge damage to the transistor including the gate insulating layer 404 and stabilize the electrical characteristics thereof.

Figure 3B:
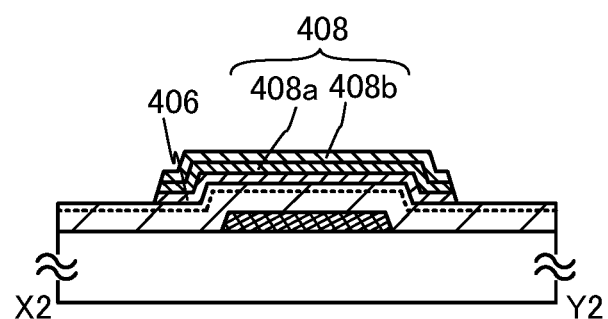

Next, an oxide insulating layer and an oxide semiconductor layer are formed over the gate insulating layer 404b and processed into an island shape by etching treatment, whereby the oxide insulating layer 406 and the oxide semiconductor layer 408 including the oxide semiconductor layer 408a and the oxide semiconductor layer 408b are formed (see FIG. 3B). Since the etching treatment can be performed using one photomask, the oxide insulating layer 406 and the oxide semiconductor layer 408 have the same pattern shape in a plan view and end portions thereof are aligned with each other.

As the oxide insulating layer 406, an oxide insulating layer containing one or more metal elements selected from the constituent elements of the oxide semiconductor layer 408 is provided. For example, it is preferable to use an insulating film such as a gallium oxide film, a gallium zinc oxide film, a gallium gadolinium oxide film, or an In—Ga—Zn-based oxide insulating film with a high gallium content and a low indium content.

The oxide semiconductor layer 408 may have either an amorphous structure or a crystalline structure. In the case where the as-formed oxide semiconductor layer has an amorphous structure, the oxide semiconductor layer may be subjected to heat treatment later in the manufacturing process so that the oxide semiconductor layer 408 has a crystalline structure. The heat treatment for crystallizing the amorphous oxide semiconductor layer is performed at a temperature higher than or equal to 250° C. and lower than or equal to 700° C., preferably higher than or equal to 400° C., more preferably higher than or equal to 500° C., further preferably higher than or equal to 550° C. Note that the heat treatment can also serve as another heat treatment in the manufacturing process.

The oxide insulating layer 406 and the oxide semiconductor layer 408 can be formed by a sputtering method, a molecular beam epitaxy (MBE) method, a CVD method, a pulsed laser deposition method, an atomic layer deposition (ALD) method, or the like as appropriate.

In the formation of the oxide insulating layer 406 and the oxide semiconductor layer 408, the concentration of hydrogen to be contained is preferably reduced as much as possible. In order to reduce the hydrogen concentration, for example, in the case where the oxide insulating layer and the oxide semiconductor layer are formed by a sputtering method, a high-purity rare gas (typically argon), high-purity oxygen, or a high-purity mixed gas of a rare gas and oxygen, from which impurities such as hydrogen, water, a hydroxyl group, and hydride have been removed, is used as appropriate as an atmosphere gas supplied to a film formation chamber of a sputtering apparatus.

The oxide insulating layer and the oxide semiconductor layer are formed in such a manner that a sputtering gas from which hydrogen and moisture are removed is introduced into a film formation chamber while moisture remaining in the film formation chamber is removed, whereby the concentration of hydrogen in the oxide insulating layer and the oxide semiconductor layer can be reduced. In order to remove moisture remaining in the film formation chamber, an entrapment vacuum pump such as a cryopump, an ion pump, or a titanium sublimation pump is preferably used. A turbo molecular pump provided with a cold trap may be alternatively used. When the film formation chamber is evacuated with a cryopump, which has a high capability in removing a hydrogen molecule, a compound including a hydrogen atom such as water ($H_2O$) (preferably, also a compound including a carbon atom), and the like, the concentration of an impurity to be contained in a film formed in the film formation chamber can be reduced.

Note that it is preferable that the oxide insulating layer and the oxide semiconductor layer be successively formed without exposure to the air. By successive formation of the oxide insulating layer and the oxide semiconductor layer without exposure to the air, hydrogen or a hydrogen compound (e.g., water) can be prevented from being attached to a surface of the oxide insulating layer or a surface of the oxide semiconductor layer stacked thereover. Thus, the entry of impurities can be reduced.

When the oxide insulating layer or the oxide semiconductor layer is formed by a sputtering method, the relative density (filling factor) of a metal oxide target that is used for the film formation is greater than or equal to 90% and less than or equal to 100%, preferably greater than or equal to 95% and less than or equal to 99.9%. With the use of the metal oxide target having high relative density, a dense oxide film can be formed.

Note that to reduce the impurity concentration of the oxide semiconductor layer, it is also effective to form the oxide semiconductor layer while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. A crystalline oxide semiconductor layer can be formed by heating the substrate at a high temperature in the formation.

In the case where a CAAC-OS film is employed as the oxide semiconductor layer 408, the CAAC-OS film can be obtained by the following methods. One method is to form an oxide semiconductor layer at a film formation temperature higher than or equal to 200° C. and lower than or equal to 450° C., thereby obtaining c-axis alignment substantially perpendicular to a surface. Another method is to form a thin oxide semiconductor layer and then subject the layer to heat treatment performed at a temperature higher than or equal to 200° C. and lower than or equal to 700° C., thereby obtaining c-axis alignment substantially perpendicular to a surface. The other method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

An oxide semiconductor used for the oxide semiconductor layer 408 contains at least indium (In). In particular, indium and zinc (Zn) are preferably contained. In addition, as a stabilizer for reducing the variation in electrical characteristics of a transistor using the oxide semiconductor, it is preferable that gallium (Ga) be additionally contained. It is preferable that one or more elements selected from tin (Sn), hafnium (Hf), aluminum (Al), and zirconium (Zr) be contained as a stabilizer.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, an In—Mg-based oxide, or an In—Ga-based oxide, a three-component metal oxide such as an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

For example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

Alternatively, a material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3) or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8) or an oxide with an atomic ratio close to the above atomic ratios may be used.

However, an oxide semiconductor containing indium that is included in a transistor is not limited to the materials given above; a material with an appropriate composition may be used for a transistor including an oxide semiconductor containing indium depending on necessary electrical characteristics (e.g., field-effect mobility, threshold voltage, and variation). In order to obtain necessary electrical characteristics, it is preferable that the carrier concentration, the impurity concentration, the defect density, the atomic ratio of a metal element to oxygen, the interatomic distance, the density, and the like be set as appropriate.

For example, high field-effect mobility can be obtained relatively easily in a transistor including an In—Sn—Zn-based oxide. Also in the case of a transistor including an In—Ga—Zn-based oxide, the field-effect mobility can be increased by reducing the defect density in a bulk.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

Further, heat treatment is preferably performed on the oxide insulating layer 406 and/or the oxide semiconductor layer 408 in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. Hydrogen, which is an impurity imparting n-type conductivity, can be removed by the heat treatment.

Note that such heat treatment for dehydration or dehydrogenation may be performed at any timing in the process of manufacturing the transistor as long as the heat treatment is performed after the formation of the oxide insulating layer and/or the oxide semiconductor layer. The heat treatment for dehydration or dehydrogenation may be performed a plurality of times, and may also serve as another heat treatment.

Note that in the case where the oxide insulating layer includes an oxygen-excess region, the heat treatment for dehydration or dehydrogenation is preferably performed before the oxide insulating layer and the oxide semiconductor layer are processed into an island shape because oxygen contained in the oxide insulating layer can be prevented from being released by the heat treatment.

In the heat treatment, it is preferable that water, hydrogen, and the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, further preferably 7N (99.99999%) or more (i.e., the impurity concentration is 1 ppm or less, preferably 0.1 ppm or less).

In addition, after the oxide semiconductor layer 408 is heated by the heat treatment, a high-purity oxygen gas, a high-purity dinitrogen monoxide gas, or ultra-dry air (with a moisture content of 20 ppm (equivalent to a dew point of −55° C.) or less, preferably 1 ppm or less, further preferably 10 ppb or less, when measured with a dew point meter using cavity ring down laser spectroscopy (CRDS)) may be introduced into the same furnace while the heating temperature is being maintained or being gradually decreased. It is preferable that water, hydrogen, and the like be not contained in the oxygen gas or the dinitrogen monoxide gas. The purity of the oxygen gas or the dinitrogen monoxide gas that is introduced into the heat treatment apparatus is preferably greater than or equal to 6N, more preferably greater than or equal to 7N (i.e., the concentration of impurities in the oxygen gas or the dinitrogen monoxide gas is preferably less than or equal to 1 ppm, more preferably less than or equal to 0.1 ppm). The oxygen gas or the dinitrogen monoxide gas acts to supply oxygen that is a main component material of the oxide semiconductor and that is reduced by the step for removing an impurity for the dehydration or dehydrogenation, so that the oxide semiconductor layer can be a highly purified i-type (intrinsic) oxide semiconductor layer.

Since there is a possibility that oxygen, which is a main component of an oxide semiconductor, is also released and reduced by dehydration or dehydrogenation treatment, oxygen (including at least one of an oxygen radical, an oxygen atom, and an oxygen ion) may be introduced to the oxide semiconductor layer which has been subjected to the dehydration or dehydrogenation treatment to supply oxygen to the layer.

Oxygen is introduced and supplied to the dehydrated or dehydrogenated oxide semiconductor layer, so that the oxide semiconductor layer can be highly purified and be i-type (intrinsic). A change in electrical characteristics of a transistor having the highly-purified and i-type (intrinsic) oxide semiconductor is suppressed, and the transistor is electrically stable.

In the step of introduction of oxygen to the oxide semiconductor layer 408, oxygen may be directly introduced to the oxide semiconductor layer 408 or may be introduced to the oxide semiconductor layer 408 through another insulating layer to be formed later. As a method for introducing oxygen (including at least one of an oxygen radical, an oxygen atom, and an oxygen ion), an ion implantation method, an ion doping method, a plasma immersion ion implantation method, plasma treatment, or the like can be used. A gas containing oxygen can be used for oxygen introduction treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment.

For example, in the case where an oxygen ion is implanted into the oxide semiconductor layer 408 by an ion implantation method, the dose can be greater than or equal to $1\times10^{13}$ ions/cm$^2$ and less than or equal to $5\times10^{16}$ ions/cm$^2$.

Alternatively, oxygen may be supplied to the oxide semiconductor layer 408 in the following manner: the oxide insulating layer 406 in contact with the oxide semiconductor layer is formed to include an oxygen-excess region; and heat treatment is performed in a state where the oxide insulating layer 406 and the oxide semiconductor layer 408 are in contact with each other, so that excess oxygen contained in the oxide insulating layer 406 is diffused into the oxide semiconductor layer 408. This heat treatment can serve as another heat treatment in the process for manufacturing the transistor.

In order to provide the oxygen-excess region in the oxide insulating layer 406, for example, the oxide insulating layer may be formed in an oxygen atmosphere. Alternatively, oxygen may be introduced into an as-formed oxide insulating layer to provide the oxygen-excess region in the oxide insulating layer 406.

The timing of supply of oxygen to the oxide insulating layer 406 or the oxide semiconductor layer 408 is not particularly limited to the above as long as it is after the formation of the oxide insulating layer or the oxide semiconductor layer. The step of introducing oxygen may be performed a plurality of times.

Figure 3C:
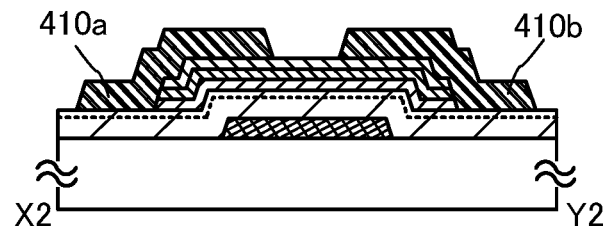

Next, a conductive film is formed over the oxide semiconductor layer 408 and then processed, whereby the source electrode layer 410a and the drain electrode layer 410b are formed (see FIG. 3C).

The source electrode layer 410a and the drain electrode layer 410b can be formed using, for example, a metal film containing an element selected from Al, Cr, Cu, Ta, Ti, Mo, and W, a metal nitride film containing any of these elements as its component (a titanium nitride film, a molybdenum nitride film, or a tungsten nitride film), or the like. Alternatively, a film of a high-melting-point metal such as Ti, Mo, or W or a metal nitride film thereof (e.g., a titanium nitride film, a molybdenum nitride film, or a tungsten nitride film) may be formed over and/or under a metal film such as an Al film or a Cu film. Further alternatively, the source electrode layer 410a and the drain electrode layer 410b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used.

For the source electrode layer 410a and the drain electrode layer 410b, a metal nitride film such as an In—Ga—Zn—O film containing nitrogen, an In—Sn—O film containing nitrogen, an In—Ga—O film containing nitrogen, an In—Zn—O film containing nitrogen, a Sn—O film containing nitrogen, or an In—O film containing nitrogen can be used. These films include the same constituent elements as the oxide semiconductor layer 408 and can therefore form a stable interface with the oxide semiconductor layer 408. For example, the source electrode layer 410a and the drain electrode layer 410b can have a stacked-layer structure in which an In—Ga—Zn—O film containing nitrogen and a tungsten film are stacked in this order from the side in contact with the oxide semiconductor layer 408.

Then, the oxide insulating layer 412 is formed so as to cover the source electrode layer 410a, the drain electrode layer 410b, and the exposed oxide semiconductor layer 408. The oxide insulating layer 412 can be formed using a material and a manufacturing method similar to those for the oxide insulating layer 406.

Figure 3D:
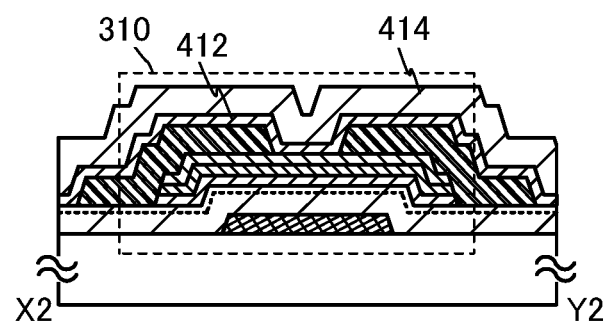

After that, the protective insulating layer 414 is formed over the oxide insulating layer 412 (see FIG. 3D).

The protective insulating layer 414 can be formed by a plasma CVD method or a sputtering method using a silicon oxide film, a gallium oxide film, an aluminum oxide film, a silicon nitride film, a silicon oxynitride film, an aluminum oxynitride film, a silicon nitride oxide film, or the like. Note that the protective insulating layer 414 is preferably a layer including a silicon film containing nitrogen, more preferably a silicon nitride film, because it is possible to further reduce electrostatic discharge damage to a semiconductor device during a manufacturing process or after manufacturing.

In the above manner, the transistor 310 in this embodiment can be formed.

<Structural Example 3 of Semiconductor Device>

Figure 10A:
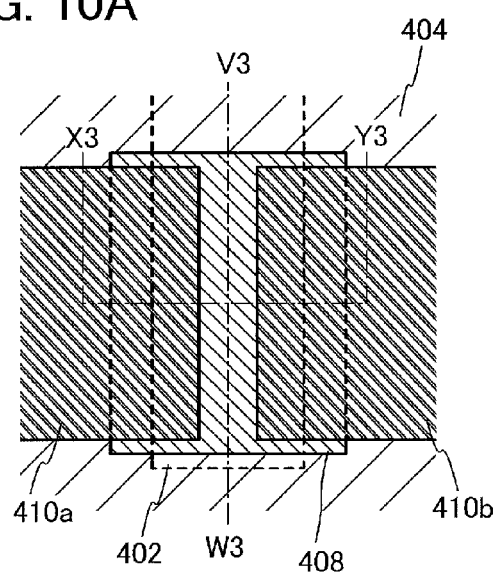
FIGS. 10A to 10C are a plan view and cross-sectional views illustrating one embodiment of a semiconductor device.
Figure 10C:
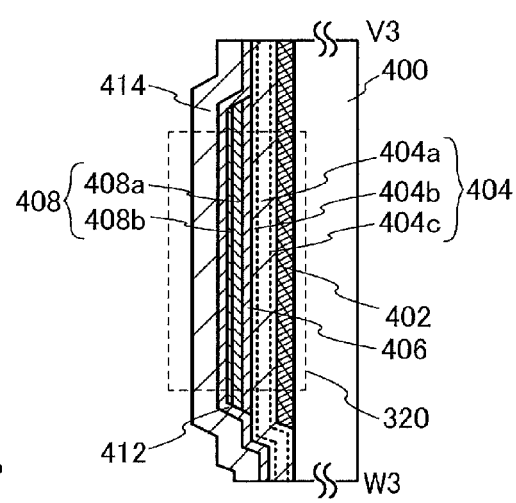
Figure 10B:
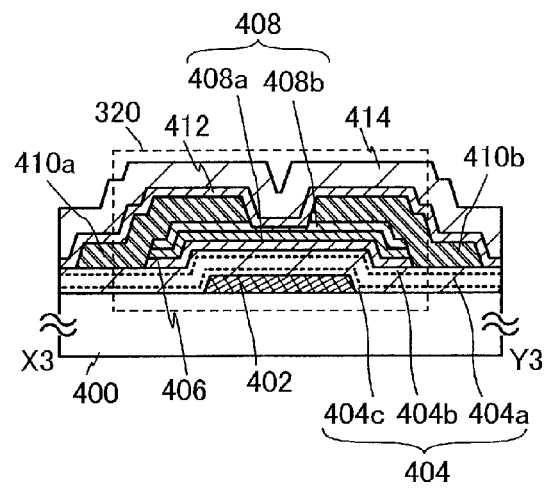

FIGS. 10A to 10C illustrate a structural example of a transistor 320. FIG. 10A is a plan view of the transistor 320, FIG. 10B is a cross-sectional view taken along the chain line X3-Y3 in FIG. 10A, and FIG. 10C is a cross-sectional view taken along the chain line V3-W3 in FIG. 10A.

Like the transistor 300 in FIGS. 1A to 1C, the transistor 320 illustrated in FIGS. 10A to 10C includes a gate electrode layer 402 over a substrate 400 having an insulating surface, a gate insulating layer 404 over the gate electrode layer 402, an oxide insulating layer 406 over the gate insulating layer 404, an oxide semiconductor layer 408 being above and in contact with the oxide insulating layer 406 and overlapping with the gate electrode layer 402, and a source electrode layer 410a and a drain electrode layer 410b electrically connected to the oxide semiconductor layer 408. As other components, the transistor 320 may include an oxide insulating layer 412 covering the source electrode layer 410a and the drain electrode layer 410b and being in contact with the oxide semiconductor layer 408 and a protective insulating layer 414 over the oxide insulating layer 412.

The transistor 320 differs from the transistor 300 in the structures of the gate insulating layer 404 and the oxide semiconductor layer 408. That is, the gate insulating layer 404 in the transistor 320 includes a gate insulating layer 404c in contact with the gate electrode layer 402, a gate insulating layer 404a over the gate insulating layer 404c, and a gate insulating layer 404b between the gate insulating layer 404a and the oxide insulating layer 406. The oxide semiconductor layer 408 in the transistor 320 includes an oxide semiconductor layer 408a in contact with the oxide insulating layer 406 and an oxide semiconductor layer 408b in contact with the oxide insulating layer 412, as in the transistor 310.

Note that other components than the gate insulating layer 404 and the oxide semiconductor layer 408 in the transistor 320 are similar to those in the transistor 300, for which the description of the transistor 300 can be referred to.

The structure of the oxide semiconductor layer 408 in the transistor 320 is similar to that in the transistor 310, for which the description of the transistor 310 can be referred to. Note that the transistor 320 is an example in which the thickness of a region of the oxide insulating layer 408b which is in contact with the oxide insulating layer 412 is smaller than the thickness of regions thereof which are in contact with the source electrode layer 410a and the drain electrode layer 410b. The region with a smaller thickness is formed by being partly etched at the time of processing a conductive film to form the source electrode layer 410a and the drain electrode layer 410b or by performing etching treatment on an exposed region of the oxide semiconductor layer 408b after forming the source electrode layer 410a and the drain electrode layer 410b. The region with a smaller thickness functions as a channel formation region of the transistor 320. By reducing the thickness of the channel formation region, the resistance of the regions in contact with the source electrode layer 410a and the drain electrode layer 410b can be made lower than that of the channel formation region. Thus, contact resistance with the source electrode layer 410a and the drain electrode layer 410b can be reduced.

The gate insulating layer 404 included in the transistor 320 includes the gate insulating layer 404c in contact with the gate electrode layer 402, the gate insulating layer 404a above and in contact with the gate insulating layer 404c, and the gate insulating layer 404b in contact with the oxide insulating layer 406.

In this embodiment, silicon nitride films are used as the gate insulating layer 404c, the gate insulating layer 404a, and the gate insulating layer 404b, and the gate insulating layers are successively formed by a plasma CVD method. First, using a mixed gas of silane ($SiH_4$) and nitrogen ($N_2$) as a supply gas, a silicon nitride film is formed as the gate insulating layer 404c. Then, the supply gas is changed to a mixed gas of silane ($SiH_4$), nitrogen ($N_2$), and ammonia ($NH_3$) and a silicon nitride film is formed as the gate insulating layer 404a. After that, the supply gas is changed to a mixed gas of silane ($SiH_4$) and nitrogen ($N_2$) and a silicon nitride film is formed as the gate insulating layer 404b.

The gate insulating layer 404c formed with a supply of the mixed gas of silane ($SiH_4$) and nitrogen ($N_2$) is formed in a film formation atmosphere containing less ammonia, and has a lower ammonia content than at least the gate insulating layer 404a formed with a supply of the mixed gas of silane ($SiH_4$), nitrogen ($N_2$), and ammonia ($NH_3$). Ammonia becomes a ligand of a metal complex by the action of a lone pair of electrons on the nitrogen atom. Thus, in the case where copper is used for the gate electrode layer 402, for example, and a gate insulating layer with a high ammonia content is provided in contact with the gate electrode layer, copper may diffuse into the gate insulating layer by the reaction represented by the following formula (1).

[Formula 1]

$$Cu^{2+} + 4NH_3 \Leftrightarrow [Cu(NH_3)_4]^{2+} \qquad (1)$$

In the transistor 320 illustrated in FIGS. 10A to 10C, since the gate insulating layer 404c having a lower ammonia content than at least the gate insulating layer 404a is provided in contact with the gate electrode layer 402, diffusion of a material of the gate electrode layer 402 (e.g., copper) into the gate insulating layer 404 can be reduced. That is, the gate insulating layer 404c can function as a barrier film against a metal material contained in the gate electrode layer 402. The gate insulating layer 404c can further improve reliability of a transistor.

Note that the gate insulating layer 404a and the gate insulating layer 404b in the gate insulating layer 404 included in the transistor 320 can be similar to those in the transistor 310. Including the gate insulating layer having the above structure, the transistor can be prevented from being damaged by electrostatic discharge and can have stable electrical characteristics. Thus, a highly reliable semiconductor device can be obtained.

The thickness of the gate insulating layer 404c is greater than or equal to 30 nm and less than or equal to 100 nm, preferably greater than or equal to 30 nm and less than or equal to 50 nm. The thickness of the gate insulating layer 404a provided as a countermeasure against electrostatic discharge damage to the transistor as described above is preferably greater than or equal to 300 nm and less than or equal to 400 nm. The thickness of the gate insulating layer 404b functioning as a barrier film which prevents diffusion of hydrogen into the oxide semiconductor layer 408 is preferably greater than or equal to 25 nm and less than or equal to 150 nm. Note that the thickness of each gate insulating layer is preferably adjusted as appropriate so that the thickness of the gate insulating layer 404 (the total thickness of the gate insulating layer 404c, the gate insulating layer 404a, and the gate insulating layer 404b) falls within the range from 355 nm to 550 nm.

<Structural Example 4 of Semiconductor Device>

Figure 11A:
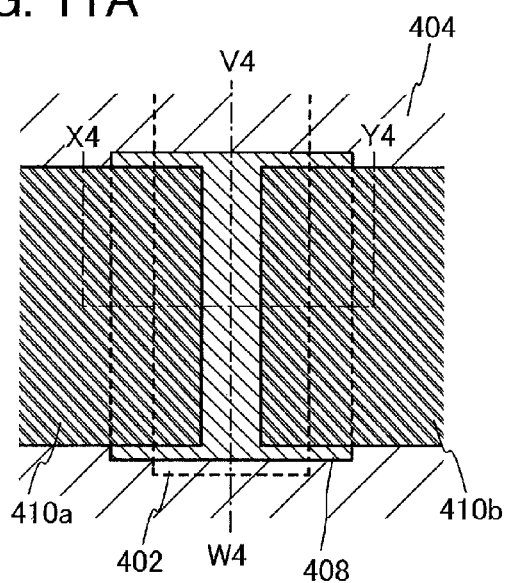
FIGS. 11A to 11C are a plan view and cross-sectional views illustrating one embodiment of a semiconductor device.
Figure 11C:
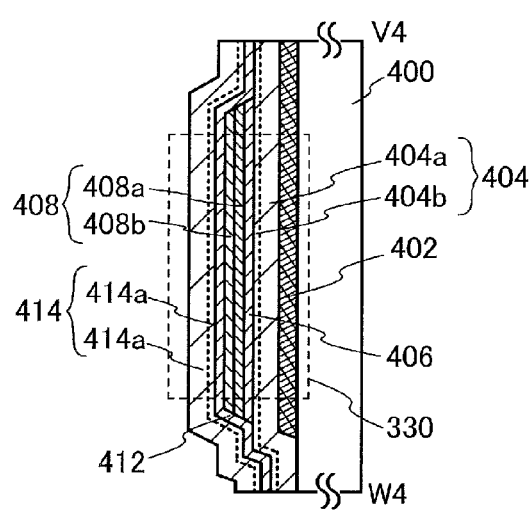
Figure 11B:
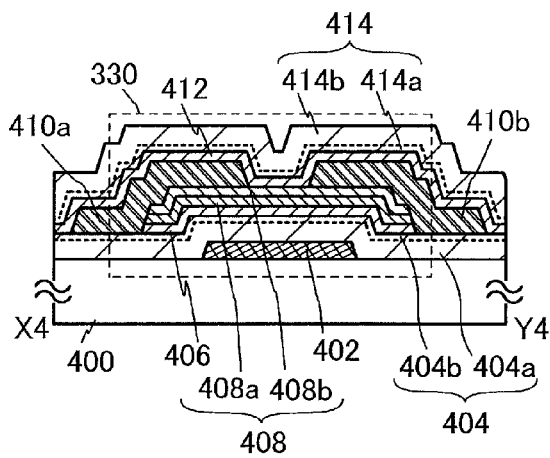

FIGS. 11A to 11C illustrate a structural example of a transistor 330. FIG. 11A is a plan view of the transistor 330, FIG. 11B is a cross-sectional view taken along the chain line X4-Y4 in FIG. 11A, and FIG. 11C is a cross-sectional view taken along the chain line V4-W4 in FIG. 11A.

The transistor 330 illustrated in FIGS. 11A to 11C includes a gate electrode layer 402 over a substrate 400 having an insulating surface, a gate insulating layer 404 over the gate electrode layer 402, an oxide insulating layer 406 over the gate insulating layer 404, an oxide semiconductor layer 408 being above and in contact with the oxide insulating layer 406 and overlapping with the gate electrode layer 402, a source electrode layer 410a and a drain electrode layer 410b electrically connected to the oxide semiconductor layer 408, an oxide insulating layer 412 covering the source electrode layer 410a and the drain electrode layer 410b and being in contact with the oxide semiconductor layer 408, and a protective insulating layer 414 over the oxide insulating layer 412.

In the transistor 330, the protective insulating layer 414 has a stacked-layer structure including a protective insulating layer 414a in contact with the oxide insulating layer 412 and a protective insulating layer 414b over the protective insulating layer 414a, for each of which a silicon nitride film can be used.

The protective insulating layer 414a can be similar to the gate insulating layer 404b of the transistor 310. The protective insulating layer 414a can reduce the entry of hydrogen or a hydrogen compound into the oxide insulating layer 412 and the oxide semiconductor layer 408; thus, the electrical characteristics of a transistor can be further stabilized.

The protective insulating layer 414b can be similar to the gate insulating layer 404a of the transistor 310. The protective insulating layer 414b can reduce electrostatic discharge damage to a semiconductor device during a manufacturing process or after manufacturing.

Note that the other components of the transistor 330 can be similar to those of the transistor 310, for which the description of the transistor 310 can be referred to.

Note that the structures of the transistors illustrated in FIGS. 1A to 1C, FIGS. 2A to 2C, FIGS. 10A to 10C, and FIGS. 11A to 11C are partly different from one another; however, embodiments of the present invention are not limited to these structures, and various combinations are possible.

The transistors described in this embodiment each include a silicon film containing nitrogen with a large thickness (e.g., greater than or equal to 325 nm and less than or equal to 550 nm) as a gate insulating layer, and an oxide insulating layer containing one or more metal elements selected from the constituent elements of an oxide semiconductor layer between the gate insulating layer and the oxide semiconductor layer. The silicon film containing nitrogen can be formed using the mass production technology that has been put to practical use. In addition, since the silicon film containing nitrogen and having a large thickness is provided, the physical thickness of the gate insulating layer can be increased, which makes it possible to reduce a decrease in withstand voltage of the transistor and furthermore increase the withstand voltage, thereby reducing electrostatic discharge damage to a semiconductor device. The oxide insulating layer can form a stable interface with the oxide semiconductor layer and reduce charge trapping at the interface. Thus, it is possible to prevent degradation of a transistor and to obtain a highly reliable transistor.

The configuration, method, and the like described in this embodiment can be combined as appropriate with any of the configurations, methods, and the like described in the other embodiments.

Embodiment 2

A semiconductor device having a display function (also referred to as a display device) can be manufactured using any of the transistors described in Embodiment 1. Moreover, some or all of the driver circuits which include the transistor can be formed over a substrate where the pixel portion is formed, whereby a system-on-panel can be obtained.

Figure 4A:
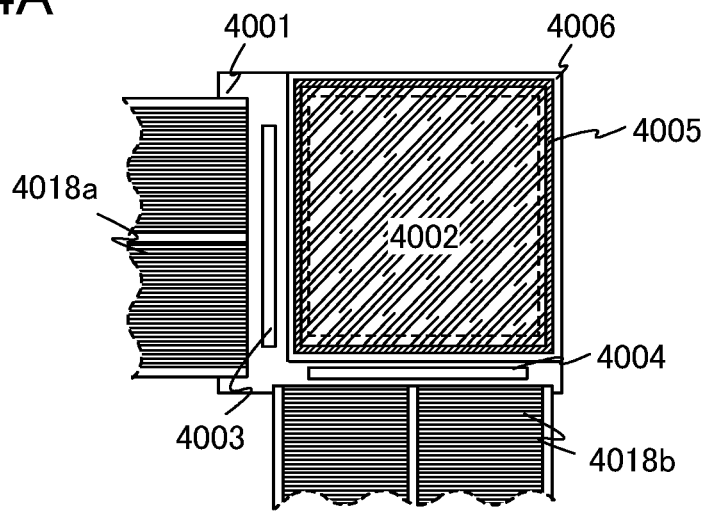
FIGS. 4A to 4C each illustrate one embodiment of a semiconductor device.

In FIG. 4A, a sealant 4005 is provided so as to surround a pixel portion 4002 provided over a substrate 4001, and the pixel portion 4002 is sealed by using a substrate 4006. In FIG. 4A, a signal line driver circuit 4003 and a scan line driver circuit 4004 which are each formed using a single crystal semiconductor film or a polycrystalline semiconductor film on an IC or over a substrate separately prepared are mounted in a region that is different from the region surrounded by the sealant 4005 over the substrate 4001. Various signals and potentials are supplied to the pixel portion 4002 through the signal line driver circuit 4003 and the scan line driver circuit 4004 from flexible printed circuits (FPCs) 4018a and 4018b.

Figure 4B:
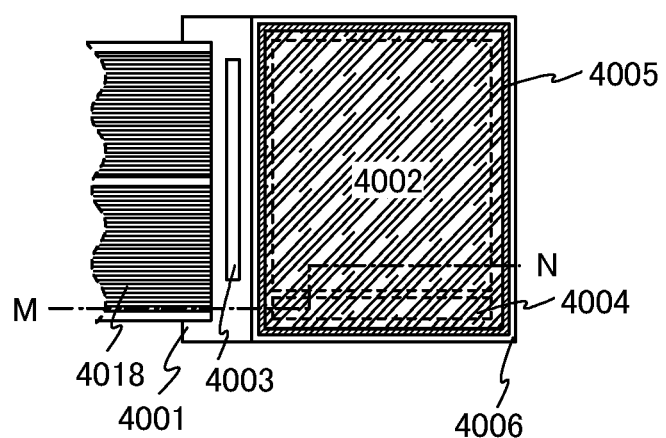
Figure 4C:
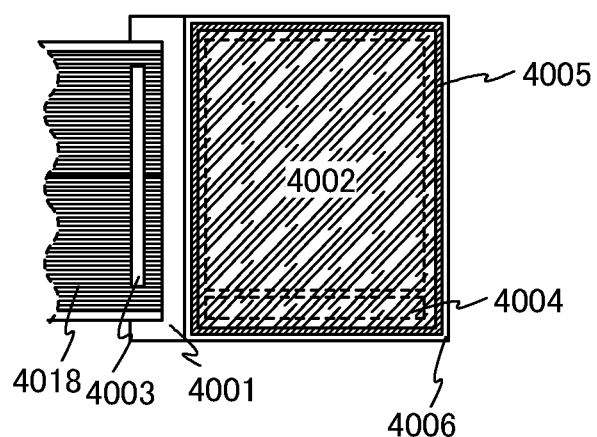

In FIGS. 4B and 4C, the sealant 4005 is provided so as to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element, by the substrate 4001, the sealant 4005, and the substrate 4006. In FIGS. 4B and 4C, the signal line driver circuit 4003 which is formed using a single crystal semiconductor film or a polycrystalline semiconductor film on an IC chip or over a substrate separately prepared is mounted in a region that is different from the region surrounded by the sealant 4005 over the substrate 4001. In FIGS. 4B and 4C, various signals and potentials are supplied to the pixel portion 4002 through the signal line driver circuit 4003 and the scan line driver circuit 4004 from an FPC 4018.

Although FIGS. 4B and 4C each illustrate an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

Note that there is no particular limitation on the method of connecting a separately formed driver circuit, and a chip on glass (COG) method, a wire bonding method, a tape automated bonding (TAB) method, or the like can be used. FIG. 4A illustrates an example in which the signal line driver circuit 4003 and the scan line driver circuit 4004 are mounted by a COG method. FIG. 4B illustrates an example in which the signal line driver circuit 4003 is mounted by a COG method. FIG. 4C illustrates an example in which the signal line driver circuit 4003 is mounted by a TAB method.

Note that display devices include a panel in which the display element is sealed, and a module in which an IC including a controller or the like is mounted on the panel. Specifically, a display device in this specification means an image display device, a display device, or a light source (including a lighting device). Furthermore, the display device also includes the following modules in its category: a module to which a connector such as an FPC or a TCP is attached; a module having a TCP at the end of which a printed wiring board is provided; and a module in which an integrated circuit (IC) is directly mounted on a display element by a COG method.

The pixel portion and the scan line driver circuit which are provided over the substrate include a plurality of transistors; any of the transistors described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as electronic ink display device (electronic paper), can be used.

Embodiments of the semiconductor device will be described with reference to FIGS. 4A to 4C, FIGS. 5A and 5B, and FIGS. 6A and 6B. FIGS. 6A and 6B correspond to cross-sectional views along line M-N in FIG. 4B.

As illustrated in FIGS. 4A to 4C and FIGS. 6A and 6B, the semiconductor device includes a connection terminal electrode 4015 and a terminal electrode 4016. The connection terminal electrode 4015 and the terminal electrode 4016 are electrically connected to a terminal included in the FPC 4018 or 4018b through an anisotropic conductive layer 4019.

The connection terminal electrode 4015 is formed using the same conductive layer as a first electrode layer 4034, and the terminal electrode 4016 is formed using the same conductive layer as source electrode layers and drain electrode layers of transistors 4010 and 4011.

The pixel portion 4002 and the scan line driver circuit 4004 which are provided over the substrate 4001 include a plurality of transistors. FIGS. 6A and 6B illustrate the transistor 4010 included in the pixel portion 4002 and the transistor 4011 included in the scan line driver circuit 4004 as an example. In FIG. 6A, an oxide insulating layer 4030 and a protective insulating layer 4032 are provided over the transistors 4010 and 4011. In FIG. 6B, an insulating layer 4021 functioning as a planarization insulating layer is further provided.

Any of the transistors described in Embodiment 1 can be applied to the transistor 4010 and the transistor 4011. Described in this embodiment is an example in which a transistor having a structure similar to that of the transistor 300 described in Embodiment 1 is used. The transistors 4010 and 4011 are bottom-gate transistors.

The transistors 4010 and 4011 each include oxide insulating layers, which contain one or more metal elements selected from the constituent elements of an oxide semiconductor layer, as an oxide insulating layer 4020b and an oxide insulating layer 4030 which are insulating layers in contact with the oxide semiconductor layer, and also include a silicon film containing nitrogen and having a large thickness (e.g., greater than or equal to 325 nm and less than or equal to 550 nm) as a gate insulating layer 4020a. Thus, in the transistors 4010 and 4011, a change in electrical characteristics is reduced, and electrostatic discharge damage is reduced.

In addition, a conductive layer may be provided so as to overlap with a channel formation region in the oxide semiconductor layer of the transistor 4011 for the driver circuit. By providing the conductive layer so as to overlap with the channel formation region in the oxide semiconductor layer, the amount of change in the threshold voltage of the transistor 4011 can be further reduced. The conductive layer may have the same potential as or a potential different from that of a gate electrode layer of the transistor 4011, and can function as a second gate electrode layer. The potential of the conductive layer may be in a floating state.

In addition, the conductive layer has a function of blocking an external electric field, that is, a function of preventing an external electric field (particularly, a function of preventing static electricity) from affecting the inside (a circuit portion including a transistor). A blocking function of the conductive layer can prevent fluctuation in the electrical characteristics of the transistor due to an influence of an external electric field such as static electricity.

The transistor 4010 provided in the pixel portion 4002 is electrically connected to a display element to form a display panel. A variety of display elements can be used as the display element as long as display can be performed.

An example of a liquid crystal display device including a liquid crystal element as a display element is illustrated in FIG. 6A. In FIG. 6A, a liquid crystal element 4013 includes the first electrode layer 4034, a second electrode layer 4031, and a liquid crystal layer 4008. Insulating layers 4038 and 4033 functioning as alignment films are provided so that the liquid crystal layer 4008 is interposed therebetween. The second electrode layer 4031 is provided on the substrate 4006 side, and the first electrode layer 4034 and the second electrode layer 4031 are stacked with the liquid crystal layer 4008 interposed therebetween.

A columnar spacer 4035 is obtained by selective etching of an insulating layer and is provided in order to control the thickness (cell gap) of the liquid crystal layer 4008. Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystal materials may be a low molecular compound or a high molecular compound. The liquid crystal materials (liquid crystal compositions) exhibit a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved.

The specific resistance of the liquid crystal material is higher than or equal to $1\times10^9$ $\Omega\cdot$cm, preferably higher than or equal to $1\times10^{11}$ $\Omega\cdot$cm, further preferably higher than or equal to $1\times10^{12}$ $\Omega\cdot$cm. Note that the specific resistance in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor including the oxide semiconductor layer disclosed in this specification, it is enough to provide a storage capacitor having a capacitance that is 1/3 or less, preferably 1/5 or less of liquid crystal capacitance of each pixel.

In the transistor which includes the oxide semiconductor layer disclosed in this specification, the current in an off state (off-state current) can be controlled so as to be small. Accordingly, an electric signal such as an image signal can be held for a longer period, and a writing interval can be set longer. Accordingly, the frequency of refresh operation can be reduced, which leads to an effect of suppressing power consumption.

The transistor which includes the oxide semiconductor layer disclosed in this specification can have relatively high field-effect mobility and thus can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element. In this embodiment, an example in which an organic EL element is used as a light-emitting element is described.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element is described here as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

Figure 5A:
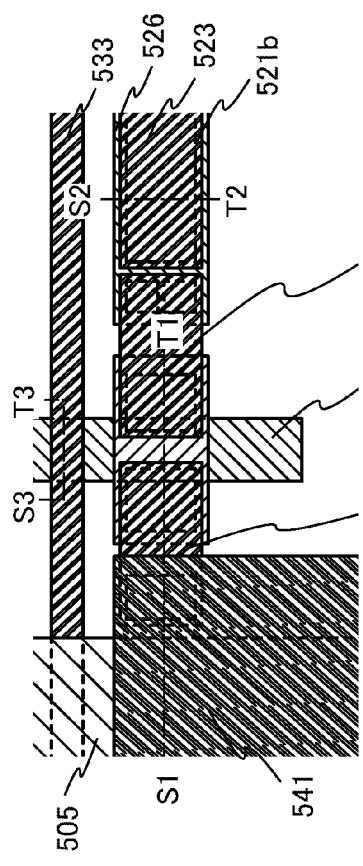
FIGS. 5A and 5B illustrate one embodiment of a semiconductor device.
Figure 5B:
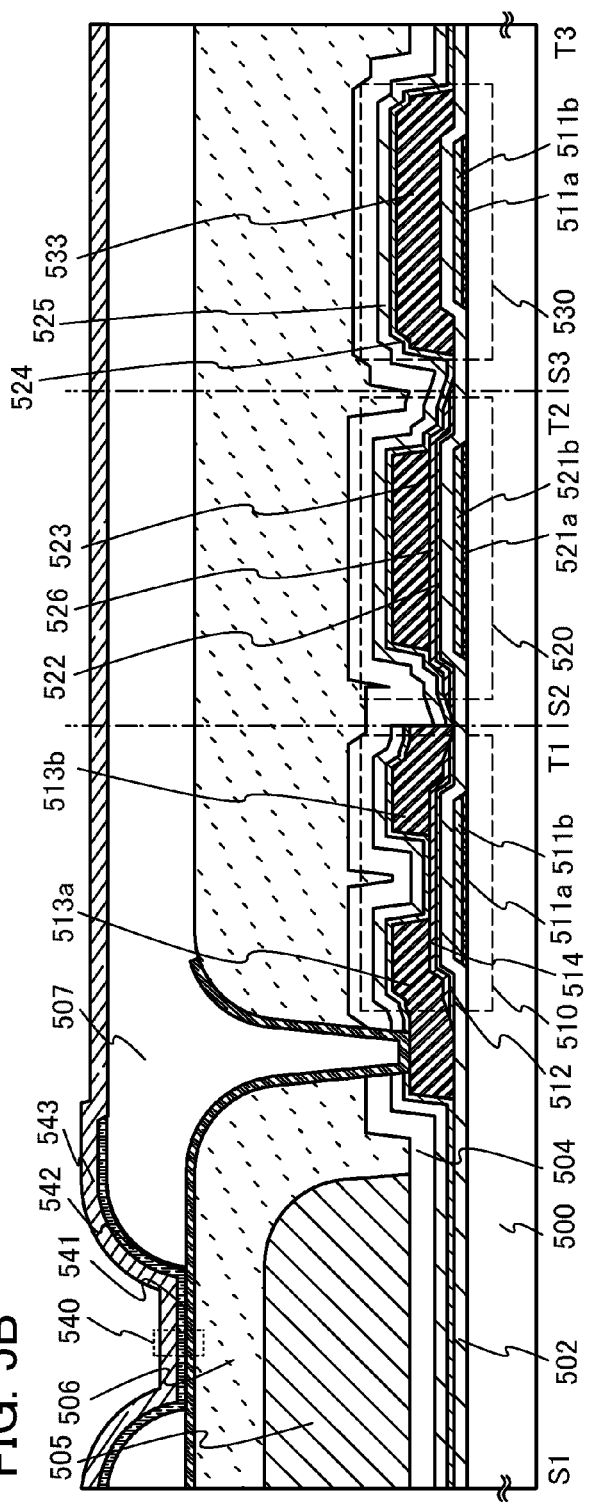

An example of a light-emitting device including a light-emitting element as a display element is illustrated in FIGS. 5A and 5B and FIG. 6B.

FIG. 5A is a plan view of the light-emitting device, and FIG. 5B is a cross-sectional view taken along the dashed-dotted lines S1-T1, S2-T2, and S3-T3 in FIG. 5A. Note that an electroluminescent layer 542 and a second electrode layer 543 are not illustrated in the plan view in FIG. 5A.

The light-emitting device illustrated in FIGS. 5A and 5B includes, over a substrate 500, a transistor 510, a capacitor 520, and an intersection 530 of wiring layers. The transistor 510 is electrically connected to a light-emitting element 540. Note that FIGS. 5A and 5B illustrate a bottom-emission light-emitting device in which light from the light-emitting element 540 is extracted through the substrate 500.

Any of the transistors described in Embodiment 1 can be applied to the transistor 510. Described in this embodiment is an example in which a transistor having a structure similar to that of the transistor 300 described in Embodiment 1 is used. The transistor 510 is a bottom-gate transistor.

The transistor 510 includes gate electrode layers 511a and 511b, a gate insulating layer 502, an oxide insulating layer 512, an oxide semiconductor layer 514, and conductive layers 513a and 513b functioning as a source electrode layer and a drain electrode layer.

The transistor 510 includes an oxide insulating layer, which contains one or more metal elements selected from the constituent elements of the oxide semiconductor layer 514, as the oxide insulating layer 512 which is an insulating layer in contact with the oxide semiconductor layer 514, and a silicon film containing nitrogen and having a large thickness (e.g., greater than or equal to 325 nm and less than or equal to 550 nm) as the gate insulating layer 502. With such a configuration, charge trapping at the interface between the oxide semiconductor layer 514 and the oxide insulating layer 512 can be reduced, and the transistor 510 can have favorable electrical characteristics. In addition, electrostatic discharge damage to the transistor 510 can be prevented. Accordingly, a highly reliable semiconductor device can be provided with high yield. Note that as the insulating layer 524 above and in contact with the oxide semiconductor layer 514, it is preferable to use an oxide insulating layer which is similar to the oxide insulating layer 512. As the insulating layer 525 above and in contact with the insulating layer 524, it is preferable to use an insulating layer which is similar to the gate insulating layer 502.

The capacitor 520 includes conductive layers 521a and 521b, the gate insulating layer 502, an oxide insulating layer 522, an oxide semiconductor layer 526, and a conductive layer 523. The gate insulating layer 502, the oxide insulating layer 522, and the oxide semiconductor layer 526 are sandwiched between the conductive layers 521a and 521b and the conductive layer 523, whereby the capacitor is formed.

The intersection 530 of wiring layers is an intersection of the gate electrode layers 511a and 511b and a conductive layer 533. The gate electrode layers 511a and 511b and the conductive layer 533 intersect each other with the gate insulating layer 502 positioned therebetween.

In this embodiment, a titanium film with a thickness of 30 nm is used for the gate electrode layer 511a and the conductive layer 521a, and a copper thin film with a thickness of 200 nm is used for the gate electrode layer 511b and the conductive layer 521b. Thus, the gate electrode layer has a stacked-layer structure of a titanium film and a copper thin film.

An In—Ga—Zn—O film with a thickness of 25 nm is used for the oxide semiconductor layers 514 and 526.

An interlayer insulating layer 504 is formed over the transistor 510, the capacitor 520, and the intersection 530 of wiring layers. Over the interlayer insulating layer 504, a color filter layer 505 is provided in a region overlapping with the light-emitting element 540. An insulating layer 506 functioning as a planarization insulating layer is provided over the interlayer insulating layer 504 and the color filter layer 505.

The light-emitting element 540 having a stacked-layer structure in which a first electrode layer 541, the electroluminescent layer 542, and the second electrode layer 543 are stacked in this order is provided over the insulating layer 506. The first electrode layer 541 and the conductive layer 513a are in contact with each other in an opening formed in the insulating layer 506 and the interlayer insulating layer 504, which reaches the conductive layer 513a; thus the light-emitting element 540 and the transistor 510 are electrically connected to each other. Note that a partition 507 is provided so as to cover part of the first electrode layer 541 and the opening.

Further, a photosensitive acrylic film with a thickness of 1500 nm and a photosensitive polyimide film with a thickness of 1500 nm can be used for the insulating layer 506 and the partition 507, respectively.

For the color filter layer 505, for example, a chromatic light-transmitting resin can be used. As such a chromatic light-transmitting resin, a photosensitive organic resin or a non-photosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the thickness of the color filter layer 505 may be greater than or equal to 1500 nm and less than or equal to 2000 nm.

In the light-emitting device illustrated in FIG. 6B, a light-emitting element 4513 is electrically connected to the transistor 4010 provided in the pixel portion 4002. A structure of the light-emitting element 4513 is not limited to the illustrated stacked-layer structure including the first electrode layer 4034, an electroluminescent layer 4511, and the second electrode layer 4031. The structure of the light-emitting element 4513 can be changed as appropriate depending on the direction in which light is extracted from the light-emitting element 4513, or the like.

A partition 4510 and the partition 507 can be formed using an organic insulating material or an inorganic insulating material. It is particularly preferable that the partitions 4510 and 507 be formed using a photosensitive resin material to have openings over the first electrode layers 4034 and 541 so that a sidewall of each opening is formed as a tilted surface with continuous curvature.

The electroluminescent layers 4511 and 542 may each be formed using either a single layer or a plurality of layers stacked.

A protective film may be formed over each of the second electrode layers 4031 and 543 and the partitions 4510 and 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Furthermore, the light-emitting elements 4513 and 540 may be covered with respective layers containing an organic compound formed by an evaporation method so that oxygen, hydrogen, moisture, carbon dioxide, or the like do not enter the light-emitting elements 4513 and 540.

In addition, in a space which is enclosed by the substrate 4001, the substrate 4006, and the sealant 4005, a filler 4514 is provided for sealing. In this manner, the light-emitting element 4513 and the like are preferably packaged (sealed) with a protective film (such as a laminate film or an ultraviolet curable resin film) or a cover material with high air-tightness and little degasification so that the light-emitting element 4513 and the like are not exposed to the outside air.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or an ethylene vinyl acetate (EVA) copolymer can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

Although the electrophoretic display device can have various modes, the electrophoretic display device contains a plurality of microcapsules dispersed in a solvent, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

A solution in which the above microcapsules are dispersed in a solvent is referred to as electronic ink. By using a color filter or particles that have a pigment, color display can also be achieved.

Note that in FIGS. 4A to 4C, FIGS. 5A and 5B, and FIGS. 6A and 6B, flexible substrates as well as glass substrates can be used as the substrate 4001, the substrate 500, and the substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

Further, the insulating layers 4021 and 506 each functioning as a planarization insulating layer can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material) such as a siloxane-based resin, phosphosilicate glass (PSG), or borophosphosilicate glass (BPSG). Note that the insulating layers 4021 and 506 may each be formed by stacking a plurality of insulating layers formed using any of these materials.

There is no particular limitation on the method of forming the insulating layers 4021 and 506, and a sputtering method, spin coating, dipping, spray coating, a droplet discharge method (such as an inkjet method), screen printing, offset printing, or the like can be used depending on the material.

The first electrode layers 4034 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or graphene.

The first electrode layers 4034 and 541 and the second electrode layers 4031 and 543 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

In this embodiment, since the light-emitting device illustrated in FIGS. 5A and 5B has a bottom-emission structure, the first electrode layer 541 has a light-transmitting property and the second electrode layer 543 has a light-reflecting property. Accordingly, in the case of using a metal film as the first electrode layer 541, the film is preferably made thin enough to secure a light-transmitting property; and in the case of using a light-transmitting conductive layer as the second electrode layer 543, a light-reflecting conductive layer is preferably stacked.

A conductive composition containing a conductive high molecule (also referred to as conductive polymer) can be used for the first electrode layers 4034 and 541 and the second electrode layers 4031 and 543. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

A protection circuit for protecting the driver circuit may also be provided. The protection circuit is preferably formed using a nonlinear element.

By using any of the transistors described in Embodiment 1 as described above, the semiconductor device can have a variety of functions.

The configuration, method, and the like described in this embodiment can be combined as appropriate with any of the configurations, methods, and the like described in the other embodiments.

Embodiment 3

A semiconductor device having an image sensor function of reading information on an object can be manufactured using any of the transistors described in Embodiment 1.

Figure 7A:
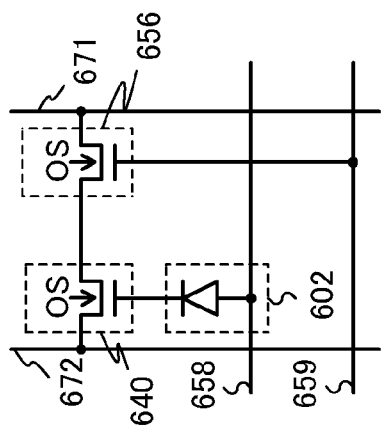
FIGS. 7A and 7B illustrate one embodiment of a semiconductor device.

FIG. 7A illustrates an example of a semiconductor device having an image sensor function. FIG. 7A is an equivalent circuit diagram of a photosensor, and FIG. 7B is a cross-sectional view illustrating part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

Note that in circuit diagrams in this specification, a transistor including an oxide semiconductor layer is denoted by a symbol "OS" so that it can be identified as a transistor including an oxide semiconductor layer. In FIG. 7A, the transistor 640 and the transistor 656 are each a transistor including an oxide semiconductor layer, to which any of the transistors described in Embodiment 1 can be applied. Described in this embodiment is an example in which a transistor having a structure similar to that of the transistor 300 described in Embodiment 1 is used. The transistor 640 is a bottom-gate transistor.

Figure 7B:
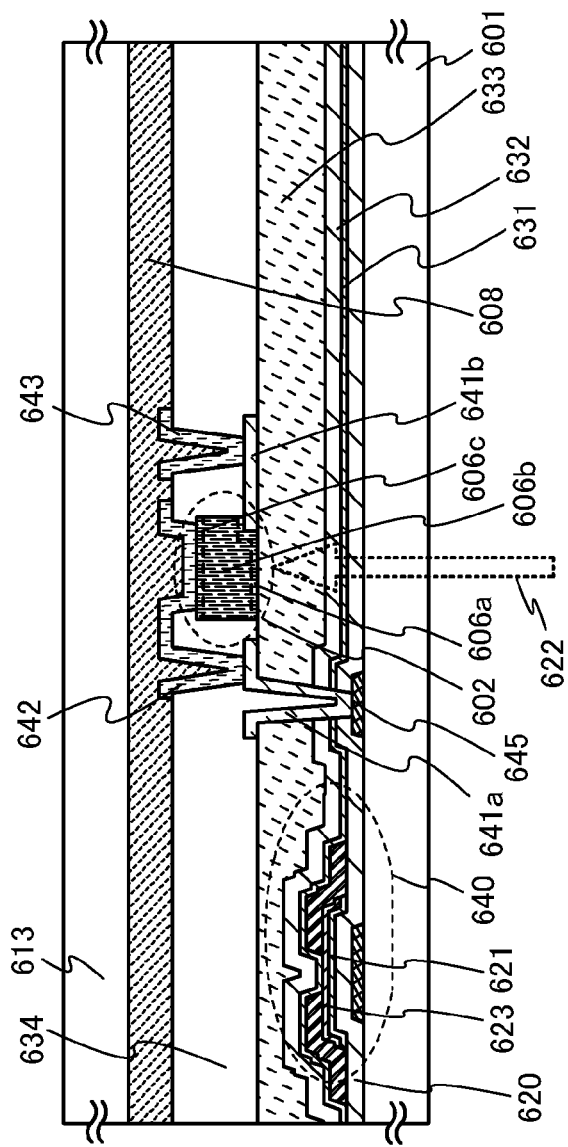

FIG. 7B is a cross-sectional view of the photodiode 602 and the transistor 640 in the photosensor. The photodiode 602 functioning as a sensor and the transistor 640 are provided over a substrate 601 (element substrate) having an insulating surface. A substrate 613 is provided over the photodiode 602 and the transistor 640 with the use of an adhesive layer 608.

An insulating layer 631, an insulating layer 632, an interlayer insulating layer 633, and an interlayer insulating layer 634 are provided over the transistor 640. The photodiode 602 includes an electrode layer 641b formed over the interlayer insulating layer 633, a first semiconductor film 606a, a second semiconductor film 606b, and a third semiconductor film 606c sequentially stacked over the electrode layer 641b, an electrode layer 642 formed over the interlayer insulating layer 634 and electrically connected to the electrode layer 641b through the first to third semiconductor films, and an electrode layer 641a formed using the same layer as the electrode layer 641b and electrically connected to the electrode layer 642.

The electrode layer 641b is electrically connected to a conductive layer 643 formed over the interlayer insulating layer 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive layer. A surface on the n-type semiconductor film side can alternatively be used as the light-receiving plane.

The transistor 640 includes an oxide insulating layer, which contains one or more metal elements selected from the constituent elements of an oxide semiconductor layer 623, as an oxide insulating layer 621 which is an insulating layer in contact with the oxide semiconductor layer 623. Thus, charge trapping at the interface between the oxide semiconductor layer 623 and the oxide insulating layer 621 can be reduced, and the electrical characteristics of the transistor 640 can be stabilized. In addition, the transistor 640 includes a silicon film containing nitrogen and having a large thickness (e.g., greater than or equal to 325 nm and less than or equal to 550 nm) as a gate insulating layer 620. Thus, electrostatic discharge damage to the transistor 640 can be prevented. By including the transistor 640, a highly reliable semiconductor device can be provided with high yield.

With the use of an insulating material, the insulating layer 631, the insulating layer 632, the interlayer insulating layer 633, and the interlayer insulating layer 634 can be formed, depending on the material, using a sputtering method, a plasma CVD method, spin coating, dipping, spray coating, a droplet discharge method (such as an inkjet method), screen printing, offset printing, or the like.

Note that as the insulating layer 631 in contact with the oxide semiconductor layer 623, it is preferable to use an oxide insulating layer containing one or more metal elements selected from the constituents elements of the oxide semiconductor layer 623. As the insulating layer 632 above and in contact with the insulating layer 631, it is preferable to provide a silicon film containing nitrogen.

For a reduction in surface roughness, an insulating layer functioning as a planarization insulating layer is preferably used as each of the interlayer insulating layers 633 and 634. For the interlayer insulating layers 633 and 634, for example, an organic insulating material having heat resistance, such as a polyimide, an acrylic resin, a benzocyclobutene-based resin, a polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

By detection of light 622 that enters the photodiode 602, information on an object to be detected can be read. Note that a light source such as a backlight can be used at the time of reading information on an object to be detected.

The configuration, method, and the like described in this embodiment can be combined as appropriate with any of the configurations, methods, and the like described in the other embodiments.

Embodiment 4

A semiconductor device according to the invention disclosed in this specification can be applied to a variety of electronic devices (including an amusement machine). Examples of electronic devices are television devices (also referred to as TV or television receivers), monitors for computers and the like, cameras such as digital cameras and digital video cameras, digital photo frames, cellular phones, portable game machines, portable information terminals, audio playback devices, amusement machines (such as pinball machines and slot machines), game consoles, and the like. Specific examples of these electronic devices are illustrated in FIGS. 8A to 8C.

Figure 8A:
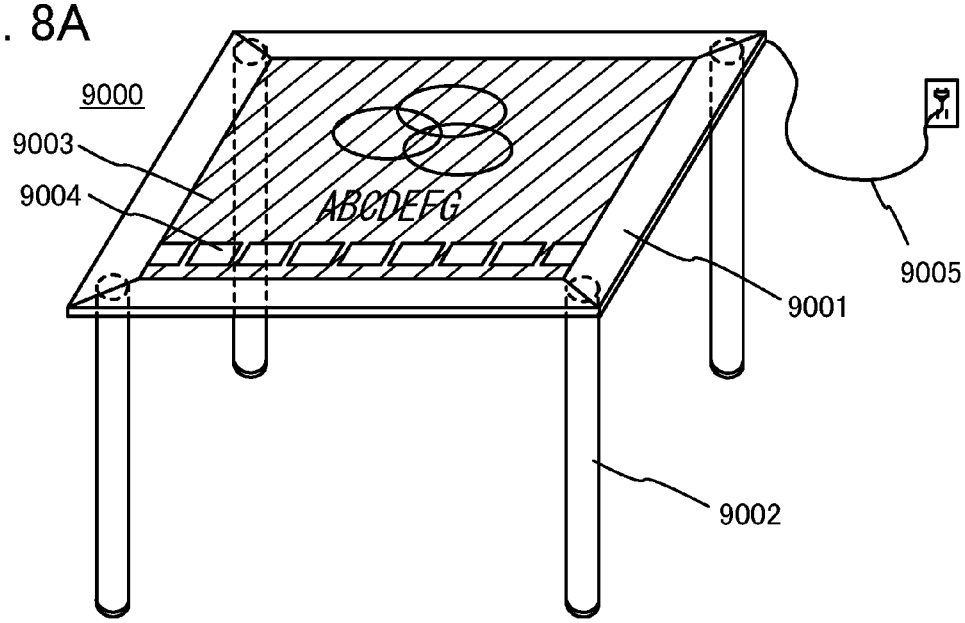
FIGS. 8A to 8C illustrate electronic devices.
Figure 8B:
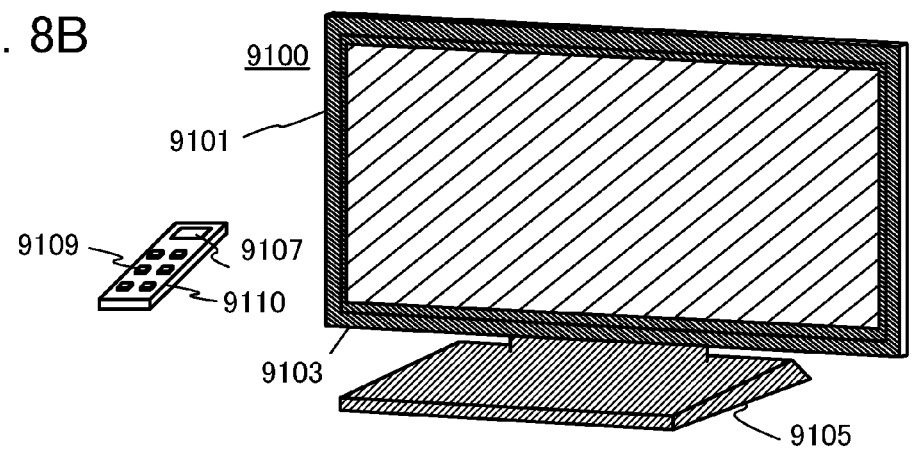
Figure 8C:
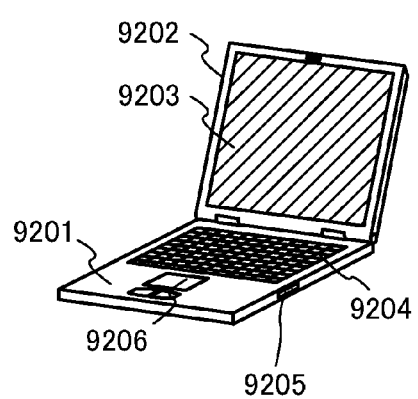

FIG. 8A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The semiconductor device described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table is capable of communicating with other home appliances or controlling the home appliances, the table 9000 may function as a control device which controls the home appliances by operation on the screen. For example, with the use of the semiconductor device having an image sensor function described in Embodiment 3, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 8B illustrates a television device 9100. In the television device 9100, a display portion 9103 is incorporated in a housing 9101 and an image can be displayed on the display portion 9103. Note that the housing 9101 is supported here by a stand 9105.

The television device 9100 can be operated with an operation switch of the housing 9101 or a separate remote controller 9110. With operation keys 9109 of the remote controller 9110, channels and volume can be controlled and images displayed on the display portion 9103 can be controlled. Furthermore, the remote controller 9110 may be provided with a display portion 9107 for displaying data output from the remote controller 9110.

The television device 9100 illustrated in FIG. 8B is provided with a receiver, a modem, and the like. With the receiver, the television device 9100 can receive general television broadcasting. Furthermore, when the television device 9100 is connected to a communication network by wired or wireless connection via the modem, one-way (from a transmitter to a receiver) or two-way (between a transmitter and a receiver, between receivers, or the like) data communication can be performed.

The semiconductor device described in any of the above embodiments can be used for the display portions 9103 and 9107, so that the television device and the remote controller can have high reliability.

FIG. 8C illustrates a computer, which includes a main body 9201, a housing 9202, a display portion 9203, a keyboard 9204, an external connection port 9205, a pointing device 9206, and the like.

The semiconductor device described in any of the above embodiments can be used for the display portion 9203, so that the computer can have high reliability.

Figure 9A:
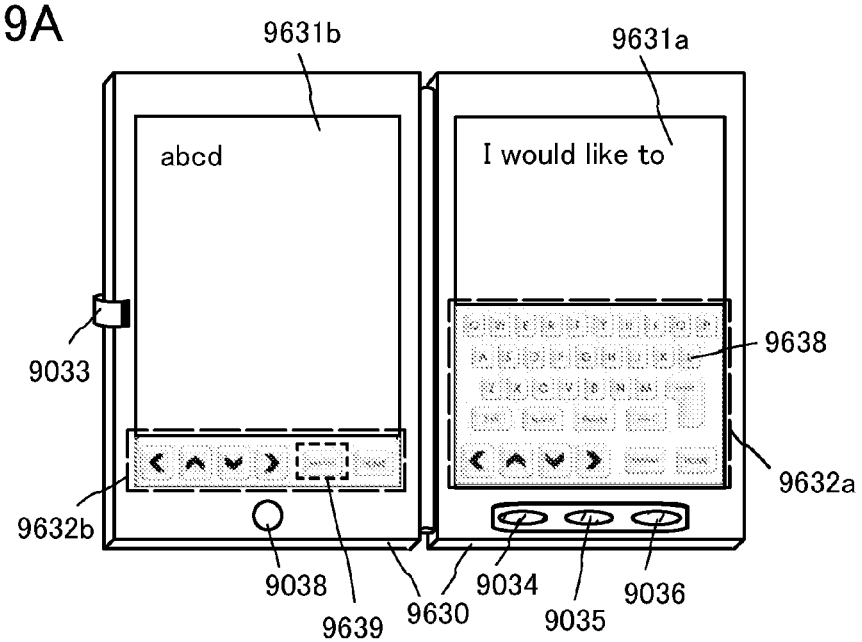
FIGS. 9A to 9C illustrate an electronic device.
Figure 9B:
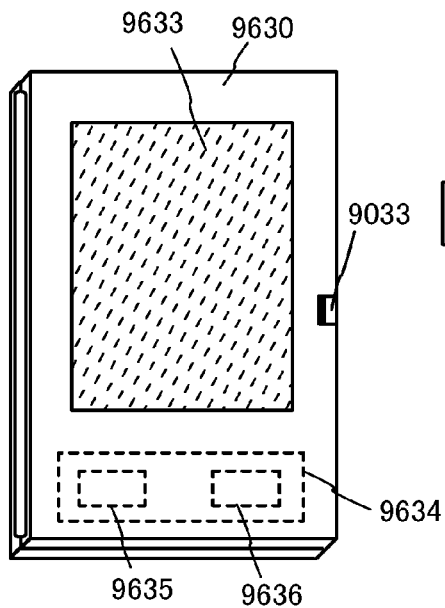

FIGS. 9A and 9B illustrate a foldable tablet terminal. The tablet terminal is opened in FIG. 9A. The tablet terminal includes a housing 9630, a display portion 9631*a*, a display portion 9631*b*, a display mode switch 9034, a power switch 9035, a power saver switch 9036, a clasp 9033, and an operation switch 9038.

The semiconductor device described in any of the above embodiments can be used for the display portion 9631*a* and the display portion 9631*b*, so that the tablet terminal can have high reliability.

Part of the display portion 9631*a* can be a touch panel region 9632*a* and data can be input when a displayed operation key 9638 is touched. Although a structure in which a half region in the display portion 9631*a* has only a display function and the other half region also has a touch panel function is shown as an example, the display portion 9631*a* is not limited to the structure. The whole region in the display portion 9631*a* may have a touch panel function. For example, the display portion 9631*a* can display keyboard buttons in the whole region to be a touch panel, and the display portion 9631*b* can be used as a display screen.

As in the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed in the touch panel region 9632*a* and the touch panel region 9632*b* at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

FIG. 9A shows an example in which the display portion 9631*a* and the display portion 9631*b* have the same display area; however, without limitation thereon, one of the display portions may be different from the other display portion in size and display quality. For example, one display panel may be capable of higher-definition display than the other display panel.

The tablet terminal is closed in FIG. 9B. The tablet terminal includes the housing 9630, a solar cell 9633, and a charge and discharge control circuit 9634. In FIG. 9B, a structure including a battery 9635 and a DCDC converter 9636 is illustrated as an example of the charge and discharge control circuit 9634.

Since the tablet terminal is foldable, the housing 9630 can be closed when the tablet terminal is not used. As a result, the display portion 9631*a* and the display portion 9631*b* can be protected; thus, a tablet terminal which has excellent durability and excellent reliability in terms of long-term use can be provided.

In addition, the tablet terminal illustrated in FIGS. 9A and 9B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

Figure 9C:
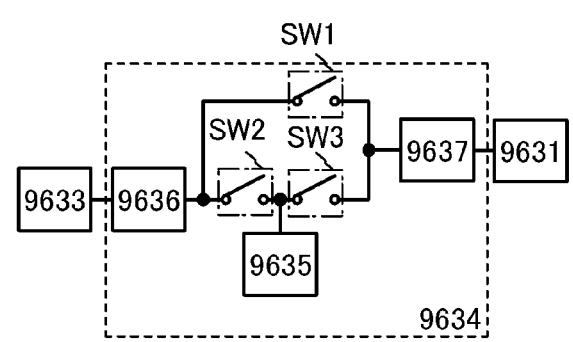

The structure and the operation of the charge and discharge control circuit 9634 illustrated in FIG. 9B will be described with reference to a block diagram in FIG. 9C. The solar cell 9633, the battery 9635, the DCDC converter 9636, a converter 9637, switches SW1 to SW3, and a display portion 9631 are illustrated in FIG. 9C, and the battery 9635, the DCDC converter 9636, the converter 9637, and the switches SW1 to SW3 correspond to the charge and discharge control circuit 9634 illustrated in FIG. 9B.

First, an example of the operation in the case where power is generated by the solar cell 9633 using external light is described. The voltage of power generated by the solar cell 9633 is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, without limitation thereon, the battery 9635 may be charged using another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

The configuration, method, and the like described in this embodiment can be combined as appropriate with any of the configurations, methods, and the like described in the other embodiments.

Example 1

In this example, results of evaluating the quality of silicon nitride films formed by a plasma CVD method will be described. Specifically, results of ESR measurements of a silicon nitride film formed using a mixed gas of silane and nitrogen as a supply gas and silicon nitride films formed using a mixed gas of silane, nitrogen, and ammonia as a supply gas are shown here.

A method for preparing samples used for the ESR measurements in this example is described below.

Samples 1 to 5 which are 300 nm thick silicon nitride films formed over quartz substrates were used for the ESR measurements. Each silicon nitride film was formed as follows. A quartz substrate was placed in a film formation chamber of a plasma CVD apparatus, the pressure in the film formation chamber was controlled so as to be 100 Pa, and a power of 2000 W was supplied from a 27.12 MHz high-frequency power source. The substrate temperature was 350° C. Note that the plasma CVD apparatus is of parallel plate type with an electrode area of 6000 cm$^2$. The sample 1 was prepared using a mixed gas of silane and nitrogen as a supply gas. The samples 2 to 5 were prepared using a mixed gas of silane, nitrogen, and ammonia as a supply gas. Film formation conditions for these samples are shown in Table 1 below.

TABLE 1

| | Supply gas flow rate [sccm] | | | Film formation rate |
|---|---|---|---|---|
| | SiH$_4$ | N$_2$ | NH$_3$ | [nm/min] |
| Sample 1 | 200 | 5000 | — | 116 |
| Sample 2 | 200 | 2000 | 100 | 126 |
| Sample 3 | 200 | 2000 | 500 | 132 |
| Sample 4 | 200 | 2000 | 1000 | 132 |
| Sample 5 | 200 | 2000 | 2000 | 126 |

The samples 1 to 5 prepared were subjected to ESR measurements. The ESR measurements were carried out under the following conditions. The measurement temperature was −170° C., the 9.2 GHz high-frequency power (microwave power) was 1 mW, the direction of magnetic field was parallel to the surface of the silicon nitride film of each of the samples 1 to 5, the lower limit of detection of spin density corresponding to a signal that appears at g=2.003 attributable to an Nc center included in the silicon nitride film was 8.1×10$^{15}$ spins/cm$^3$.

Figure 12A:
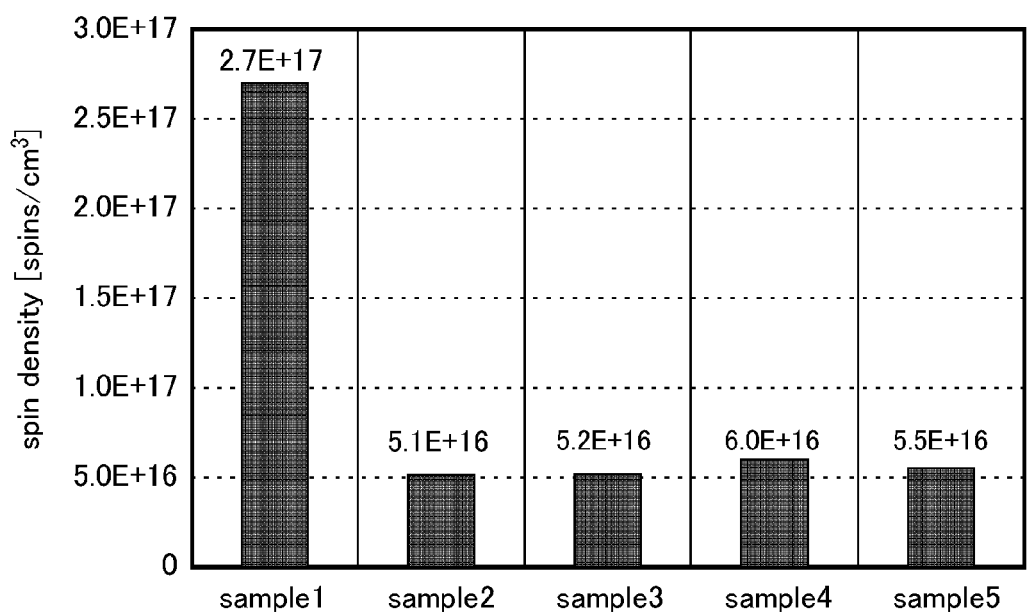
FIGS. 12A and 12B show results of ESR measurement.

FIG. 12A shows results of the ESR measurements. It can be confirmed from FIG. 12A that the sample 1 prepared with a supply gas containing no ammonia has a spin density of 2.7×10$^{17}$ spins/cm$^3$ attributable to an Nc center and is a silicon nitride film including a large number of defects. Meanwhile, it can be confirmed that the samples 2 to 5 prepared with a supply gas containing ammonia all have low spin densities of 5.1×10$^{16}$ spins/cm$^3$, 5.2×10$^{16}$ spins/cm$^3$, 6.0×10$^{16}$ spins/cm$^3$, and 5.5×10$^{16}$ spins/cm$^3$, respectively, attributable to an Nc center, independently of the flow rate of ammonia and are silicon nitride films including a small number of defects.

Figure 12B:
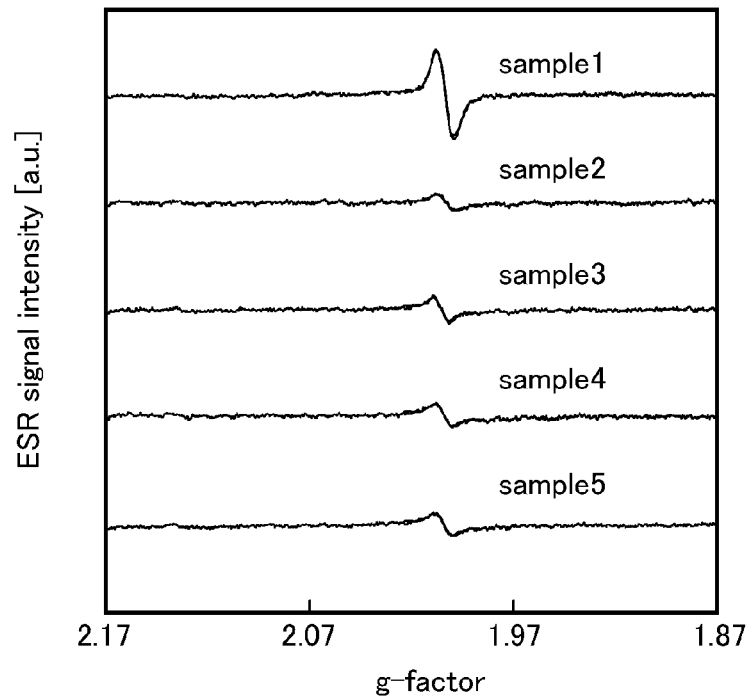

FIG. 12B shows first derivative curves obtained by the ESR measurements. As shown in FIG. 12B, a high-intensity signal attributable to a defect (Nc center) in the film was detected in the sample 1 at a g-factor of 2.003. Meanwhile, low-intensity signals were observed from the samples 2 to 5 at a g-factor of 2.003.

The above results suggest that a silicon nitride film including a small number of defects can be formed by using a mixed gas of silane, nitrogen, and ammonia as a supply gas at the time of forming the silicon nitride film by a plasma CVD method. This implies that the silicon nitride film can be used as a gate insulating layer with a favorable withstand voltage and a transistor including the gate insulating layer can have favorable resistance to ESD.

Example 2

Figure 13A:
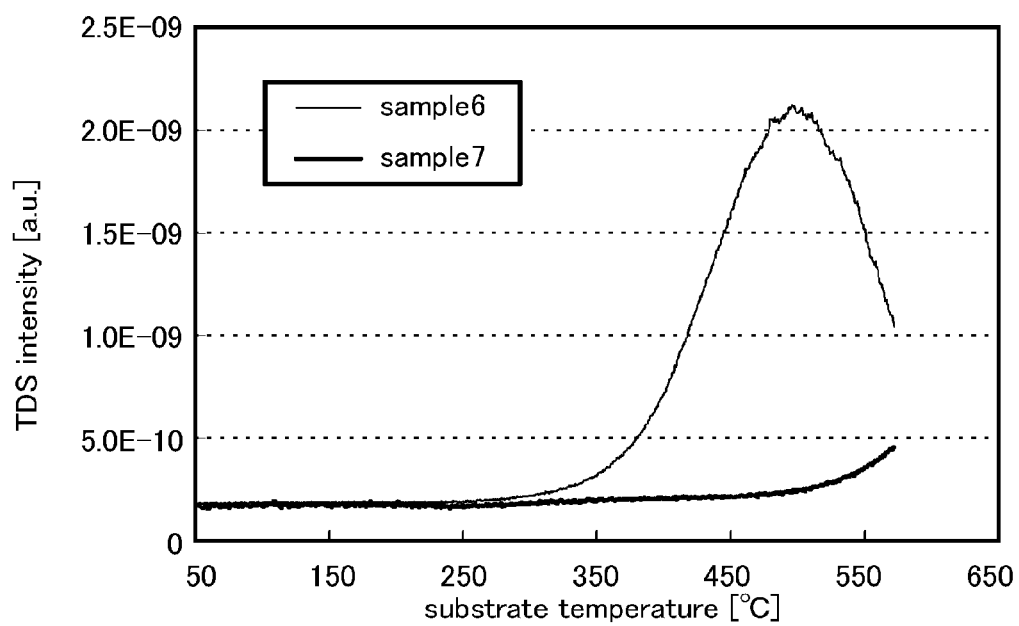
FIGS. 13A and 13B show results of TDS measurement.
Figure 13B:
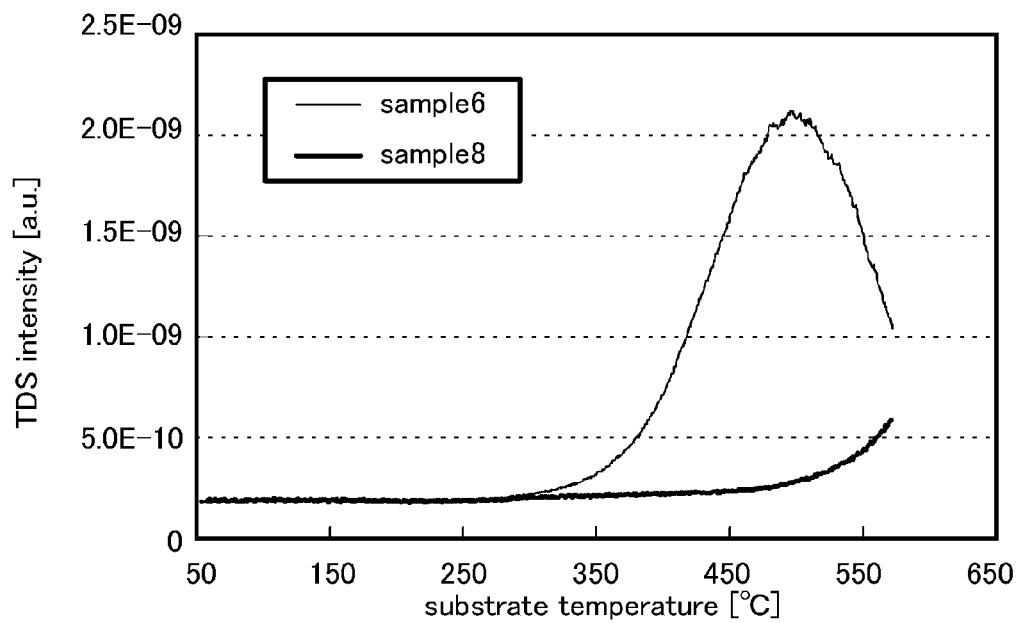

In this example, characteristics, as barrier films, of silicon nitride films formed by a plasma CVD method are evaluated. FIGS. 13A and 13B show evaluation results. As an evaluation method, thermal desorption spectroscopy (TDS) was used.

In this example, samples 6 to 8 which are silicon nitride films formed over quartz substrates by a plasma CVD method were used for the evaluation. A method for preparing samples is described below.

Each silicon nitride film was formed as follows. A quartz substrate was placed in a film formation chamber of a plasma CVD apparatus, the pressure in the film formation chamber was controlled so as to be 100 Pa, and a power of 2000 W was supplied from a 27.12 MHz high-frequency power source. The substrate temperature was 350° C. Note that the plasma CVD apparatus is of parallel plate type with an electrode area of 6000 cm$^2$.

As the sample 6, a 300 nm thick silicon nitride film was formed using a mixed gas of silane, nitrogen, and ammonia (SiH$_4$ flow rate: 200 sccm, N$_2$ flow rate: 2000 sccm, NH$_3$ flow rate: 2000 sccm) as a supply gas.

As the sample 7, a first silicon nitride film with a thickness of 275 nm was formed using a mixed gas of silane, nitrogen, and ammonia (SiH$_4$ flow rate: 200 sccm, N$_2$ flow rate: 2000 sccm, NH$_3$ flow rate: 2000 sccm) as a supply gas and then a second silicon nitride film with a thickness of 50 nm was formed in the same film formation chamber using a mixed gas of silane and nitrogen (SiH$_4$ flow rate: 200 sccm, N$_2$ flow rate: 5000 sccm).

As the sample 8, a first silicon nitride film with a thickness of 275 nm was formed using a mixed gas of silane, nitrogen, and ammonia (SiH$_4$ flow rate: 200 sccm, N$_2$ flow rate: 2000 sccm, NH$_3$ flow rate: 2000 sccm) as a supply gas and then a second silicon nitride film with a thickness of 50 nm was formed in the same film formation chamber at a lower ammonia flow rate (SiH$_4$ flow rate: 200 sccm, N$_2$ flow rate: 2000 sccm, NH$_3$ flow rate: 100 sccm).

FIGS. 13A and 13B show results of TDS measurements of the samples at m/z=2 ($H_2$). FIG. 13A shows results of TDS measurements of the samples 6 and 7 prepared in this example at m/z=2 ($H_2$), and FIG. 13B shows results of TDS measurements of the samples 6 and 8 at m/z=2 ($H_2$).

It can be confirmed from FIGS. 13A and 13B that hydrogen is desorbed by heat treatment from the sample 6 that is the single-layer silicon nitride film having a high hydrogen concentration. Meanwhile, it can be confirmed that hydrogen desorption from the samples 7 and 8 in each of which the silicon nitride film having a low hydrogen concentration is stacked as an upper layer does not occur at around 450° C. where hydrogen desorption occurs from the sample 6, and even when heat treatment is further continued, hydrogen desorption is highly suppressed.

Thus, it can be seen that a hydrogen blocking effect (barrier effect) is achieved by providing a silicon nitride film having a low hydrogen concentration as an upper layer in contact with a silicon nitride film having a high hydrogen concentration.

As described in Example 1, a silicon nitride film formed by a plasma CVD method using silane, nitrogen, and ammonia as a supply gas includes a small number of defects and has high withstand voltage. Accordingly, the structure in which the silicon nitride film having a low hydrogen concentration is stacked over the silicon nitride film including a small number of defects can reduce desorption of hydrogen which may serve as a donor in an oxide semiconductor layer while maintaining high resistance to ESD, and the structure is therefore suitable as a gate insulating layer of a transistor.

EXPLANATION OF REFERENCE

300: transistor, 310: transistor, 320: transistor, 330: transistor, 400: substrate, 402: gate electrode layer, 404: gate insulating layer, 404a: gate insulating layer, 404b: gate insulating layer, 404c: gate insulating layer, 406: oxide insulating layer, 408: oxide semiconductor layer, 408a: oxide semiconductor layer, 408b: oxide semiconductor layer, 410a: source electrode layer, 410b: drain electrode layer, 412: oxide insulating layer, 414: protective insulating layer, 414a: protective insulating layer, 414b: protective insulating layer, 500: substrate, 502: gate insulating layer, 504: interlayer insulating layer, 505: color filter layer, 506: insulating layer, 507: partition, 510: transistor, 511a: gate electrode layer, 511b: gate electrode layer, 512: oxide insulating layer, 513a: conductive layer, 513b: conductive layer, 514: oxide semiconductor layer, 520: capacitor, 521a: conductive layer, 521b: conductive layer, 522: oxide insulating layer, 523: conductive layer, 524: insulating layer, 525: insulating layer, 526: oxide semiconductor layer, 530: intersection of wiring layers, 533: conductive layer, 540: light-emitting element, 541: electrode layer, 542: electroluminescent layer, 543: electrode layer, 601: substrate, 602: photodiode, 606a: semiconductor film, 606b: semiconductor film, 606c: semiconductor film, 608: adhesive layer, 613: substrate, 620: gate insulating layer, 621: oxide insulating layer, 622: light, 623: oxide semiconductor layer, 631: insulating layer, 632: insulating layer, 633: interlayer insulating layer, 634: interlayer insulating layer, 640: transistor, 641a: electrode layer, 641b: electrode layer, 642: electrode layer, 643: conductive layer, 645: conductive layer, 656: transistor, 658: photodiode reset signal line, 659: gate signal line, 671: photosensor output signal line, 672: photosensor reference signal line, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive layer, 4020a: gate insulating layer, 4020b: oxide insulating layer, 4021: insulating layer, 4030: oxide insulating layer, 4031: electrode layer, 4032: protective insulating layer, 4033: insulating layer, 4034: electrode layer, 4035: spacer, 4038: insulating layer, 4510: partition, 4511: electroluminescent layer, 4513: light-emitting element, 4514: filler, 9000: table, 9001: housing, 9002: leg portion, 9003: display portion, 9004: display button, 9005: power cord, 9033: clasp, 9034: switch, 9035: power switch, 9036: power saver switch, 9038: operation switch, 9100: television device, 9101: housing, 9103: display portion, 9105: stand, 9107: display portion, 9109: operation key, 9110: remote controller, 9201: main body, 9202: housing, 9203: display portion, 9204: keyboard, 9205: external connection port, 9206: pointing device, 9630: housing, 9631: display portion, 9631a: display portion, 9631b: display portion, 9632a: region, 9632b: region, 9633: solar cell, 9634: charge and discharge control circuit, 9635: battery, 9636: DCDC converter, 9637: converter, 9638: operation key, and 9639: button.

This application is based on Japanese Patent Application serial no. 2012-108899 filed with Japan Patent Office on May 10, 2012, the entire contents of which are hereby incorporated by reference.

What is claimed is:

1. A semiconductor device comprising:
   a gate electrode and an oxide semiconductor layer with a gate insulating layer therebetween;
   the gate insulating layer and an insulating layer in contact with and sandwiching the oxide semiconductor layer;
   a protective insulating layer over and in contact with the insulating layer;
   source and drain electrodes between the oxide semiconductor layer and the insulating layer;
   the insulating layer comprises a metal element selected from constituent elements of the oxide semiconductor layer;
   the gate insulating layer is in contact with a bottom surface of the oxide semiconductor layer;
   the insulating layer is in contact with a top surface of the oxide semiconductor layer;
   the gate insulating layer comprises a first gate insulating layer and a second gate insulating layer over the first gate insulating layer; and
   a wiring electrically connected to the drain electrode via an opening in the insulating layer,
   wherein each of the first gate insulating layer and the second gate insulating layer comprises a silicon film containing nitrogen,
   wherein the protective insulating layer comprises a silicon film containing nitrogen,
   wherein a thickness of the protective insulating layer is larger than that of the insulating layer, and
   wherein a hydrogen concentration of the second gate insulating layer is lower than that of the first gate insulating layer.

2. The semiconductor device according to claim 1, further comprising:
   an oxide insulating layer between the second gate insulating layer and the oxide semiconductor layer.

3. The semiconductor device according to claim 1, wherein the oxide semiconductor layer comprises indium, gallium, and zinc.

4. The semiconductor device according to claim 1, wherein the insulating layer comprises oxygen.

5. The semiconductor device according to claim 1, wherein the gate electrode comprises copper.

6. A display device comprising the semiconductor device according to claim 1.

7. A semiconductor device comprising:
a gate electrode and an oxide semiconductor layer with a gate insulating layer therebetween;
the gate insulating layer and an insulating layer in contact with and sandwiching the oxide semiconductor layer;
a protective insulating layer over and in contact with the insulating layer;
source and drain electrodes between the oxide semiconductor layer and the insulating layer;
the insulating layer comprises a metal element selected from constituent elements of the oxide semiconductor layer;
the gate insulating layer is in contact with a bottom surface of the oxide semiconductor layer;
the insulating layer is in contact with a top surface of the oxide semiconductor layer;
the gate insulating layer comprises a first gate insulating layer and a second gate insulating layer over the first gate insulating layer;
the oxide semiconductor layer comprises a first oxide semiconductor layer in contact with the gate insulating layer and a second oxide semiconductor layer in contact with the insulating layer; and
a wiring electrically connected to the drain electrode via an opening in the insulating layer,
wherein each of the first gate insulating layer and the second gate insulating layer comprises a silicon film containing nitrogen,
wherein the protective insulating layer comprises a silicon film containing nitrogen,
wherein a thickness of the protective insulating layer is larger than that of the insulating layer, and
wherein a hydrogen concentration of the second gate insulating layer is lower than that of the first gate insulating layer.

8. The semiconductor device according to claim 7, further comprising:
an oxide insulating layer between the second gate insulating layer and the oxide semiconductor layer.

9. The semiconductor device according to claim 7, wherein the insulating layer comprises oxygen.

10. The semiconductor device according to claim 7, wherein the oxide semiconductor layer comprises indium, gallium, and zinc.

11. The semiconductor device according to claim 7, wherein a content of indium in the first oxide semiconductor layer is higher than a content of indium in the second oxide semiconductor layer.

12. The semiconductor device according to claim 7, wherein a content of indium in the second oxide semiconductor layer is lower than a content of gallium in the second oxide semiconductor layer.

13. The semiconductor device according to claim 7, wherein the gate electrode comprises copper.

14. A display device comprising the semiconductor device according to claim 7.

* * * * *